US011143600B2

(12) United States Patent
Honda et al.

(10) Patent No.: US 11,143,600 B2
(45) Date of Patent: Oct. 12, 2021

(54) DEFECT INSPECTION DEVICE

(71) Applicant: Hitachi High-Tech Corporation, Tokyo (JP)

(72) Inventors: Toshifumi Honda, Tokyo (JP); Masami Makuuchi, Tokyo (JP); Shunichi Matsumoto, Tokyo (JP); Akira Hamamatsu, Tokyo (JP); Nobuhiro Obara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/961,340

(22) PCT Filed: Feb. 16, 2018

(86) PCT No.: PCT/JP2018/005548
§ 371 (c)(1),
(2) Date: Jul. 10, 2020

(87) PCT Pub. No.: WO2019/159334
PCT Pub. Date: Aug. 22, 2019

(65) Prior Publication Data
US 2020/0371047 A1 Nov. 26, 2020

(51) Int. Cl.
*G01N 21/956* (2006.01)
*G01N 21/47* (2006.01)
(Continued)

(52) U.S. Cl.
CPC ........... *G01N 21/956* (2013.01); *G01N 21/47* (2013.01); *G01N 21/8851* (2013.01);
(Continued)

(58) Field of Classification Search
CPC .... G01N 21/47; G01N 21/4738; G01N 21/88; G01N 21/8803; G01N 21/8806;
(Continued)

(56) References Cited

U.S. PATENT DOCUMENTS 5,032,734 A * 7/1991 Orazio, Jr. ............. G01N 21/21
250/559.46
5,541,416 A 7/1996 Washizuka
(Continued)

FOREIGN PATENT DOCUMENTS

JP 61212708 9/1986
JP 62-89336 B2 4/1987
(Continued)

OTHER PUBLICATIONS

Hamamatsu: MPPC Multi-Pixel Photon Counter, Aug. 2007.
(Continued)

*Primary Examiner* — Gordon J Stock, Jr.
(74) *Attorney, Agent, or Firm* — Miles & Stockbridge, P.C.

(57) ABSTRACT

The invention includes a pulse oscillated light source, an illumination unit that guides light output from the light source to a sample, a scanning unit that controls a position at which the sample is scanned by the illumination unit, a light converging unit that converges light reflected from the sample, a first photoelectric conversion unit that outputs an electric signal corresponding to the light converged by the light converging unit, an AD conversion unit that converts the electric signal output from the first photoelectric conversion unit into a digital signal in synchronization with pulse oscillation of the light source, a linear restoration unit that processes a digital signal converted by the AD conversion unit in synchronization with a pulse oscillation output by the AD conversion unit and corrects nonlinearity of the first photoelectric conversion unit, a defect detection unit that detects a defect of the sample based on an output of the linear restoration unit, and a processing unit that obtains and outputs a position and a size of the defect detected by the defect detection unit.

10 Claims, 22 Drawing Sheets

(51) Int. Cl.
  *G01N 21/88* (2006.01)
  *G01N 21/89* (2006.01)
  *H01L 21/66* (2006.01)
  *G03F 7/20* (2006.01)
  *G01N 21/95* (2006.01)

(52) U.S. Cl.
  CPC ..... *G01N 21/8901* (2013.01); *G01N 21/8903* (2013.01); *G01N 21/9501* (2013.01); *G03F 7/7065* (2013.01); *H01L 22/12* (2013.01); *G01N 2021/8861* (2013.01); *G01N 2021/8874* (2013.01); *G01N 2021/8896* (2013.01); *G01N 2201/06113* (2013.01)

(58) Field of Classification Search
  CPC ............... G01N 21/8851; G01N 21/89; G01N 21/8901; G01N 21/8903; G01N 2021/8809; G01N 2021/8812; G01N 2021/8816; G01N 2021/8819; G01N 2021/8822; G01N 2021/8825; G01N 2021/8829; G01N 2021/8832; G01N 2021/8838; G01N 2021/8841; G01N 2021/8845; G01N 2021/8848; G01N 2021/8854; G01N 2021/8858; G01N 2021/8861; G01N 2021/8864; G01N 2021/8867; G01N 2021/887; G01N 2021/8874; G01N 2021/8877; G01N 2021/888; G01N 2021/8883; G01N 2021/8887; G01N 2021/889; G01N 2021/8893; G01N 2021/8896; G01N 2021/8902; G01N 2021/8904; G01N 2021/8905; G01N 2021/8907; G01N 2021/8908; G01N 2021/8924; G01N 2021/8925; G01N 2021/8927; G01N 2021/8928; G01N 2021/8962; G01N 2021/8965; G01N 21/892; G01N 21/8921; G01N 21/8922; G01N 21/894; G01N 21/896; G01N 21/898; G01N 21/94; G01N 21/95; G01N 21/9501; G01N 21/9503; G01N 21/9505; G01N 21/9506; G01N 21/956; G01N 21/95607; G01N 21/95623; G01N 21/95684; G01N 2201/06113; G03F 7/7065; H01L 22/12
  See application file for complete search history.

(56) References Cited

U.S. PATENT DOCUMENTS

| | | | |
|---|---|---|---|
| 5,903,342 A | 5/1999 | Yatsugake et al. | |
| 7,463,350 B2* | 12/2008 | Nishiyama | G01N 21/95684 356/237.4 |
| 7,505,125 B2 | 3/2009 | Andrews et al. | |
| 7,973,919 B2* | 7/2011 | Grossman | G01N 21/1717 356/237.2 |
| 8,634,069 B2* | 1/2014 | Nakano | G01N 21/95607 356/237.1 |
| 8,670,116 B2 | 3/2014 | Nakao et al. | |
| 8,755,044 B2* | 6/2014 | Reich | G01N 21/94 356/237.4 |
| 9,239,283 B2* | 1/2016 | Honda | G01N 21/00 |
| 9,568,437 B2* | 2/2017 | Matsumoto | G01N 21/956 |
| 10,228,332 B2* | 3/2019 | Honda | G01N 21/9501 |
| 10,254,235 B2* | 4/2019 | Nakao | H01L 22/12 |
| 10,324,045 B2* | 6/2019 | Cui | G01N 21/956 |
| 10,642,164 B2* | 5/2020 | Otani | G03F 7/70191 |
| 10,830,706 B2* | 11/2020 | Honda | G01N 21/8806 |
| 2001/0048522 A1 | 12/2001 | Yonezawa | |
| 2004/0207836 A1 | 10/2004 | Chhibber et al. | |
| 2005/0185172 A1 | 8/2005 | Ishimaru et al. | |
| 2006/0067471 A1 | 3/2006 | Hopkins et al. | |
| 2006/0256325 A1 | 11/2006 | Mcmillan et al. | |
| 2007/0013898 A1 | 1/2007 | Wolters et al. | |
| 2008/0273193 A1 | 11/2008 | Nishiyama et al. | |
| 2009/0009753 A1 | 1/2009 | Horai et al. | |
| 2009/0290168 A1 | 11/2009 | Hamamatsu et al. | |
| 2010/0004875 A1 | 1/2010 | Urano et al. | |
| 2010/0060895 A1 | 3/2010 | Oshima et al. | |
| 2012/0194807 A1 | 8/2012 | Maruyama et al. | |
| 2013/0016346 A1 | 1/2013 | Romanovsky et al. | |
| 2013/0050689 A1 | 2/2013 | Reich et al. | |
| 2013/0286385 A1 | 10/2013 | Miyazaki et al. | |
| 2013/0313442 A1 | 11/2013 | Wang et al. | |
| 2013/0321798 A1 | 12/2013 | Urano et al. | |
| 2014/0233024 A1 | 8/2014 | Taniguchi et al. | |
| 2014/0253912 A1 | 9/2014 | Honda et al. | |
| 2015/0146200 A1 | 5/2015 | Honda et al. | |
| 2018/0038803 A1 | 2/2018 | Cui et al. | |
| 2020/0271594 A1* | 8/2020 | Matsumoto | G01N 21/9501 |

FOREIGN PATENT DOCUMENTS

| | | |
|---|---|---|
| JP | 1117024 | 5/1989 |
| JP | 02080942 | 3/1990 |
| JP | 4152545 B2 | 5/1992 |
| JP | H04-279846 A | 10/1992 |
| JP | H05-118826 A | 5/1993 |
| JP | 5218163 B2 | 8/1993 |
| JP | 09304289 | 11/1997 |
| JP | 11258157 | 9/1999 |
| JP | 2000046734 A | 2/2000 |
| JP | 2006201179 A | 8/2006 |
| JP | 2008-275540 A | 11/2008 |
| JP | 2009-501902 A | 1/2009 |
| JP | 2010014635 A | 1/2010 |
| JP | 201169659 A | 4/2011 |
| JP | 2013-29438 A | 2/2013 |
| JP | 2013-108950 A | 6/2013 |
| JP | 2013-231631 A | 11/2013 |
| JP | 2014-524033 A | 9/2014 |
| JP | 2014-525565 A | 9/2014 |
| WO | 2017122320 A1 | 7/2017 |

OTHER PUBLICATIONS

Office Action for related Japanese Patent Application No. 2014-262004 (dated Oct. 6, 2015).
Search Report dated May 15, 2018 in corresponding International Application No. PCT/JP2018/005548.
Written Opinion and International Preliminary Report on Patentability dated Sep. 10, 2018 in corresponding International Application No. PCT/JP2018/005548.

* cited by examiner

[FIG. 1]
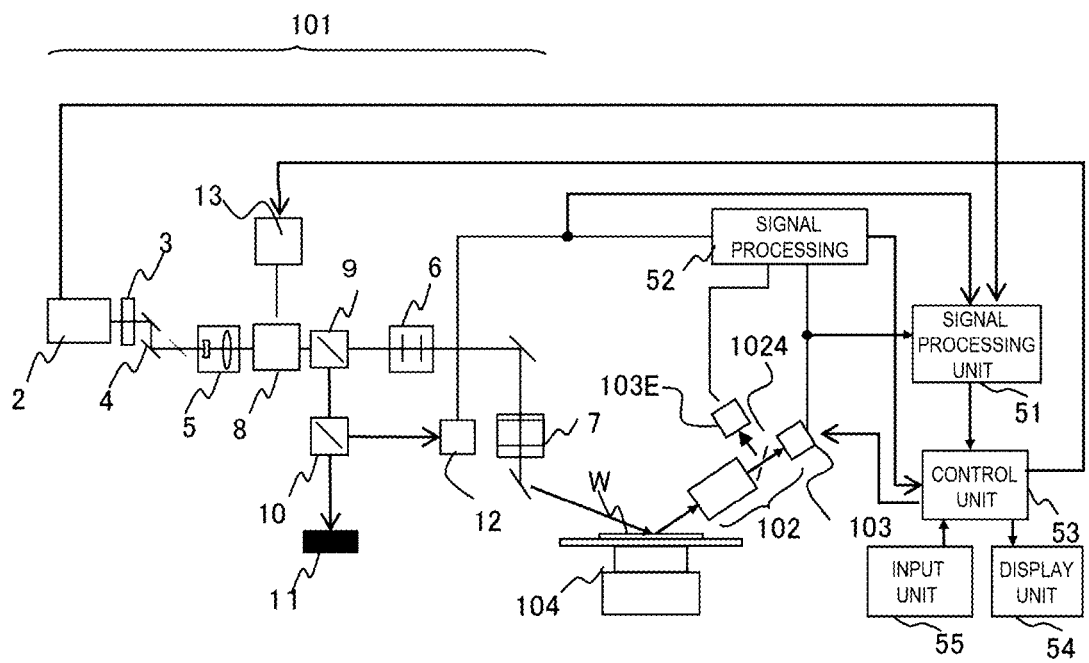
[FIG. 2]
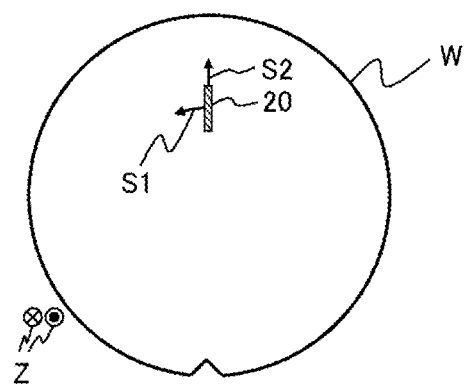

[FIG. 3]
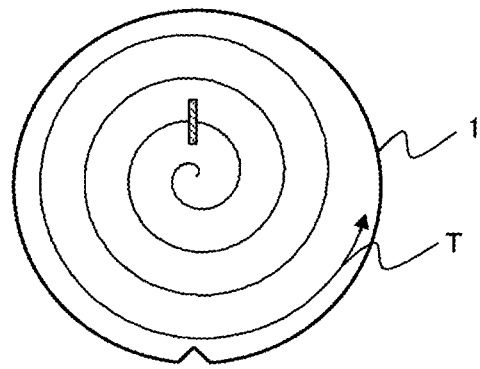
[FIG. 4]
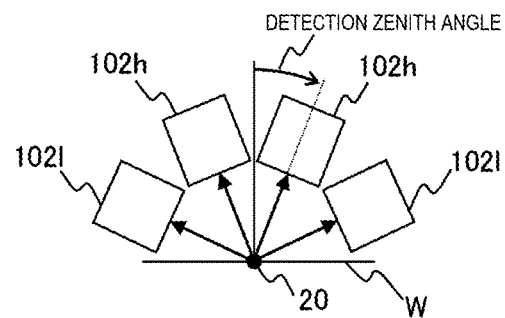
[FIG. 5]
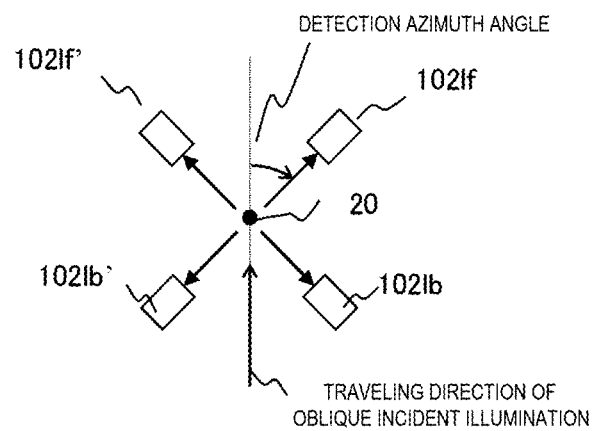

[FIG. 6]
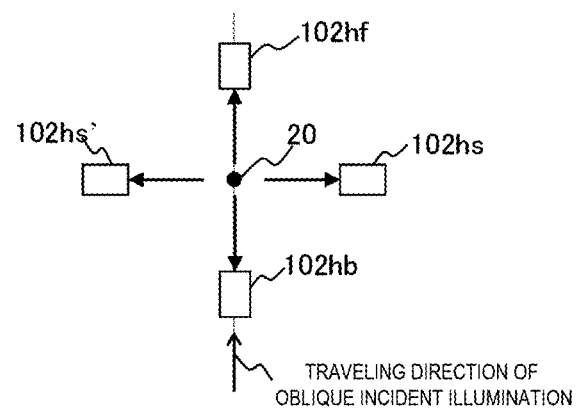

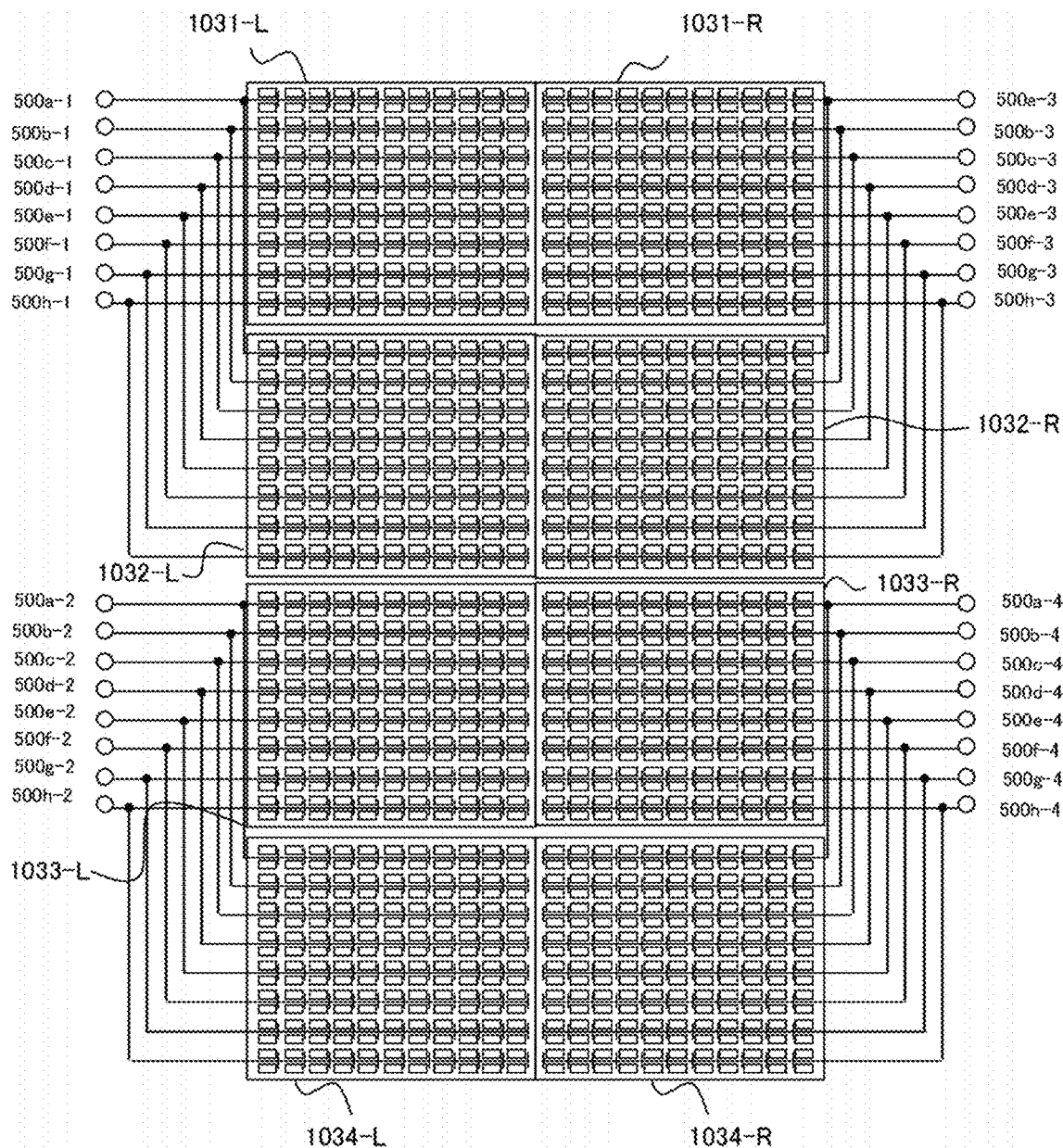
[FIG. 8]

[FIG. 9]
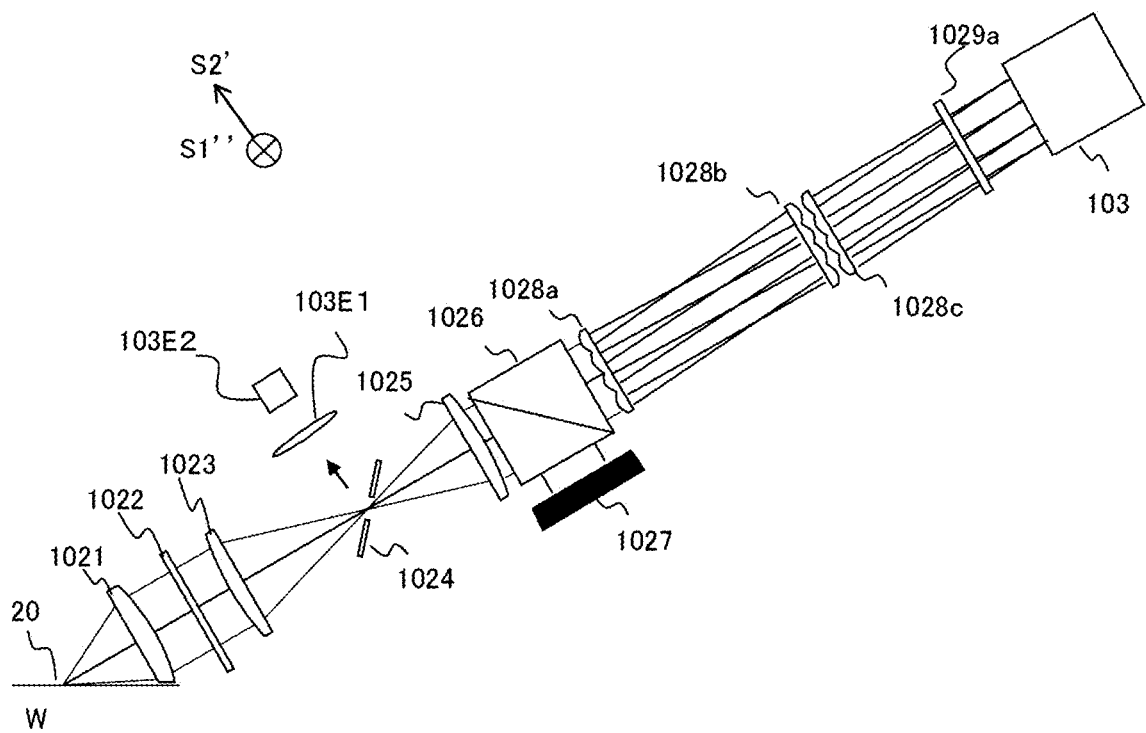
[FIG. 10]
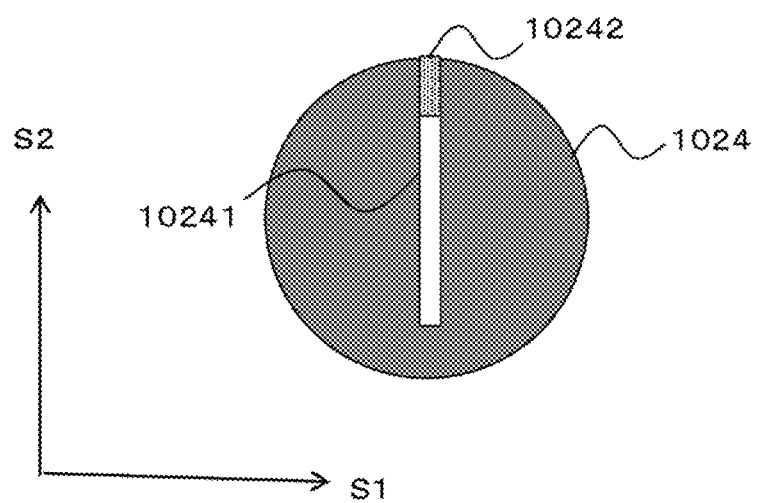

1/2 WAVELENGTH PLATE 1022-1

SEGMENTAL WAVELENGTH PLATE 1022-2

LIGHT SHIELDING PLATE 1022-3

[FIG. 13]
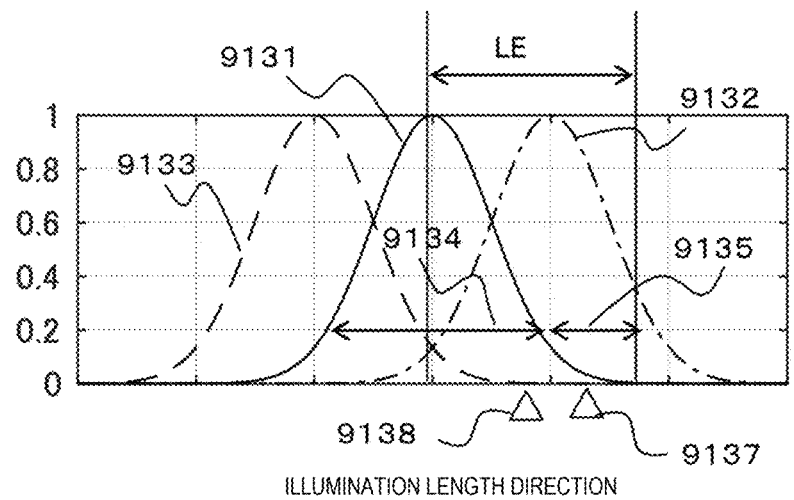
[FIG. 14]
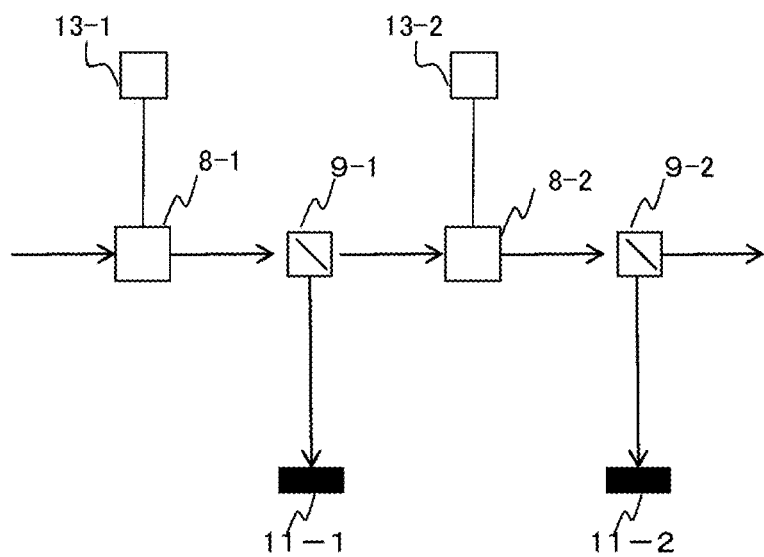

[FIG. 15]
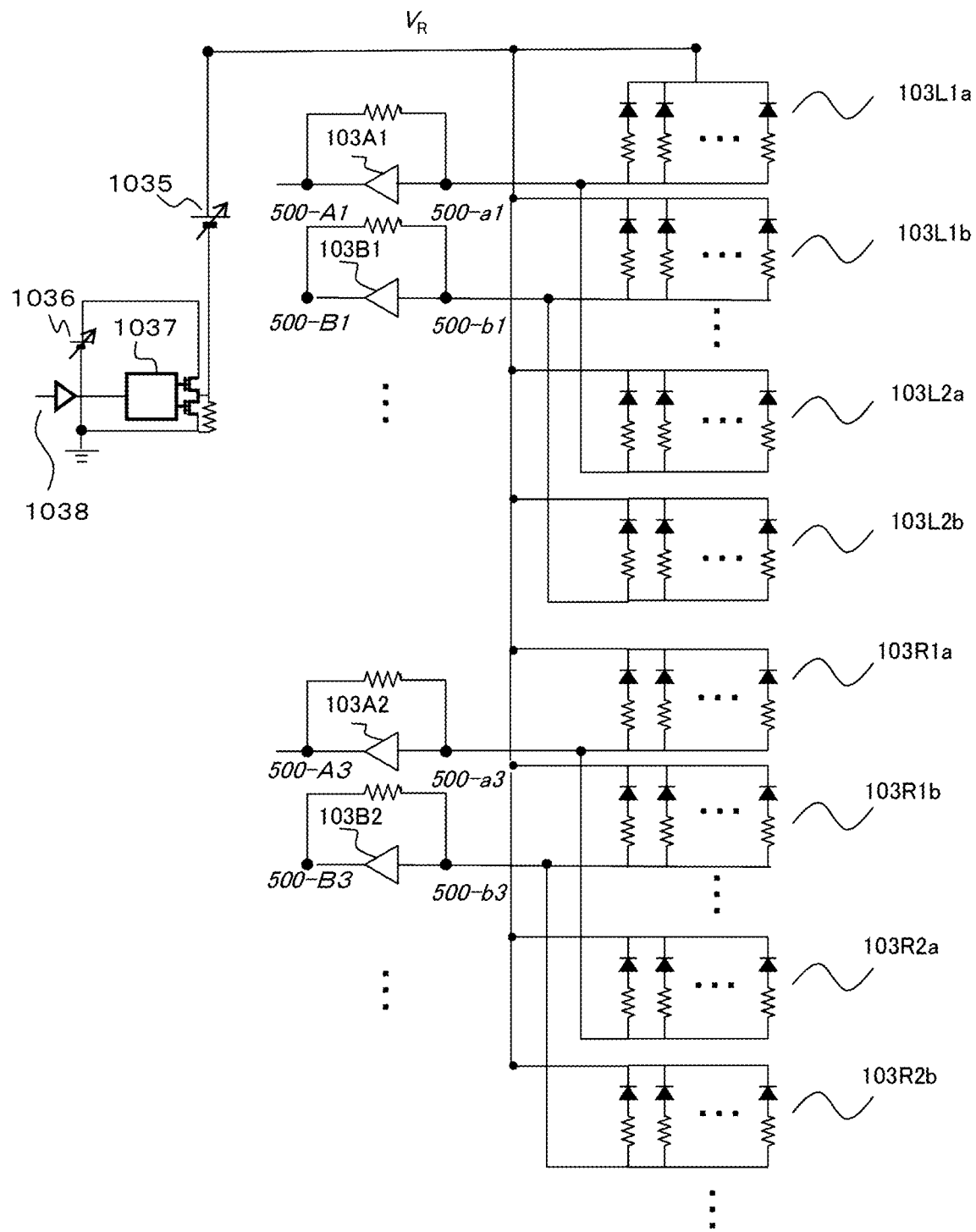

[FIG. 16]
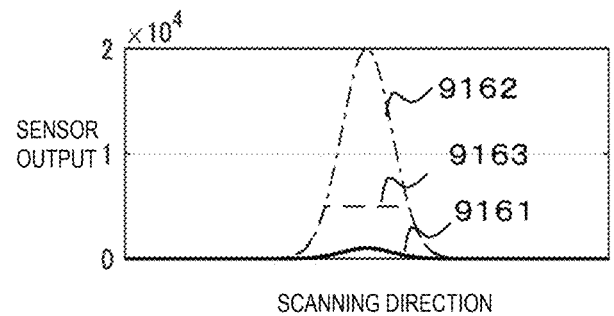
[FIG. 17]
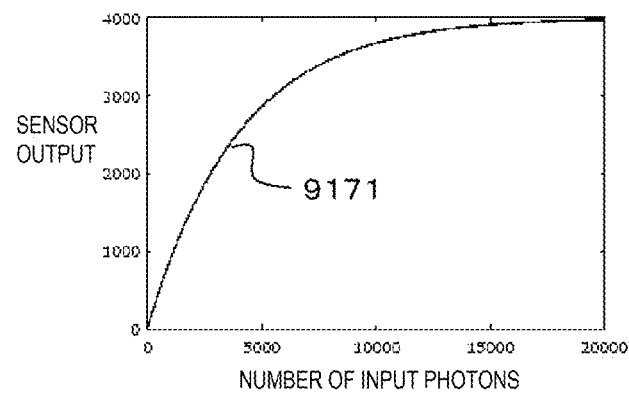
[FIG. 18]
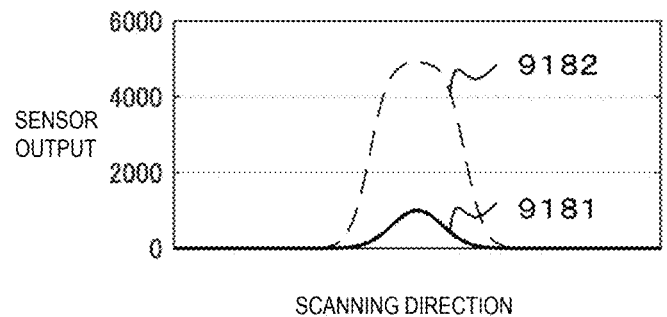

[FIG. 19]
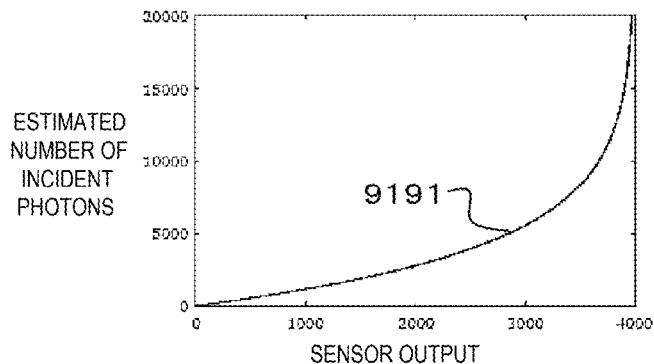
[FIG. 20]
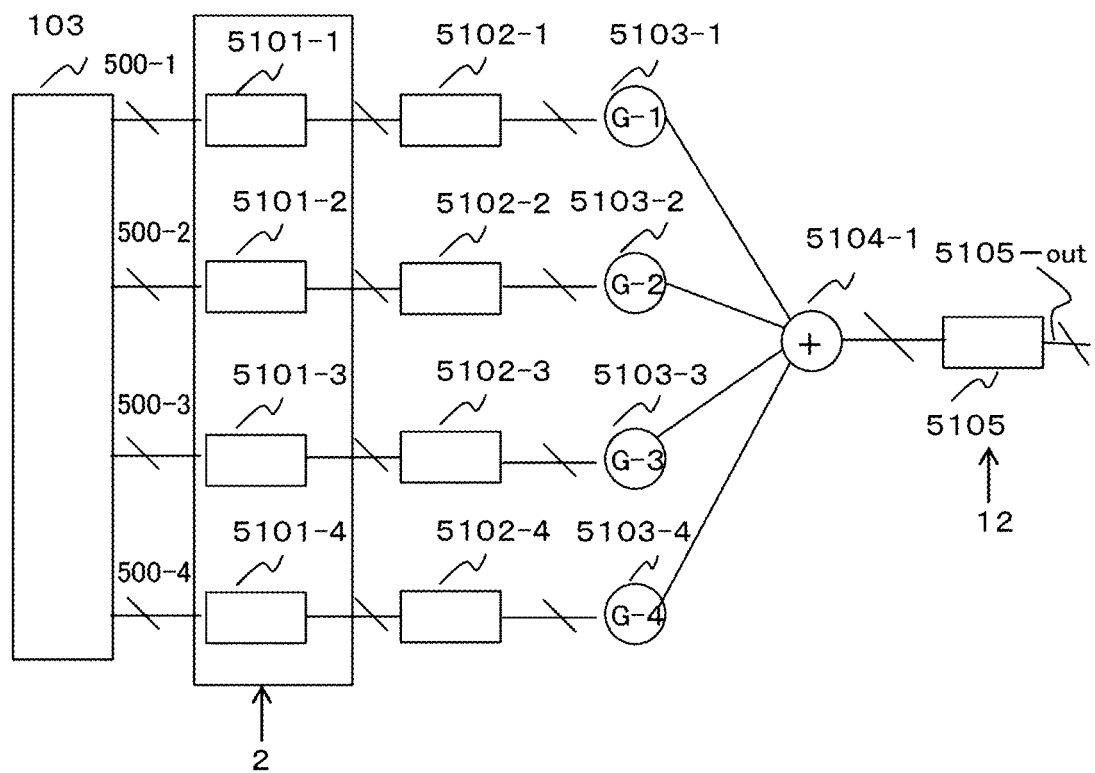

[FIG. 21]
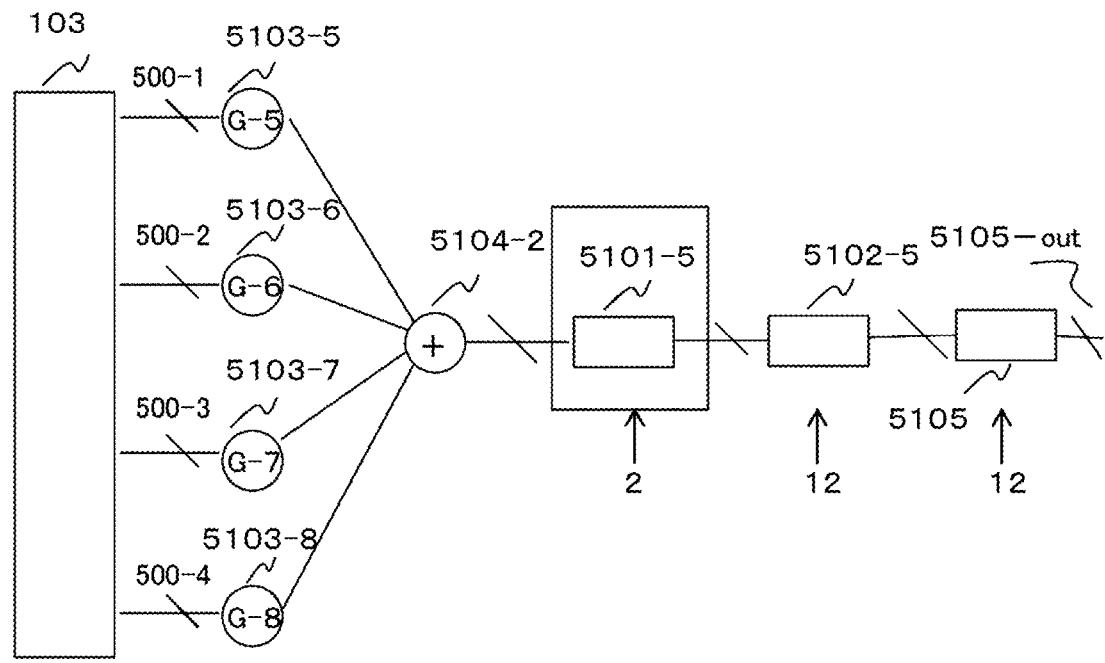
[FIG. 22]
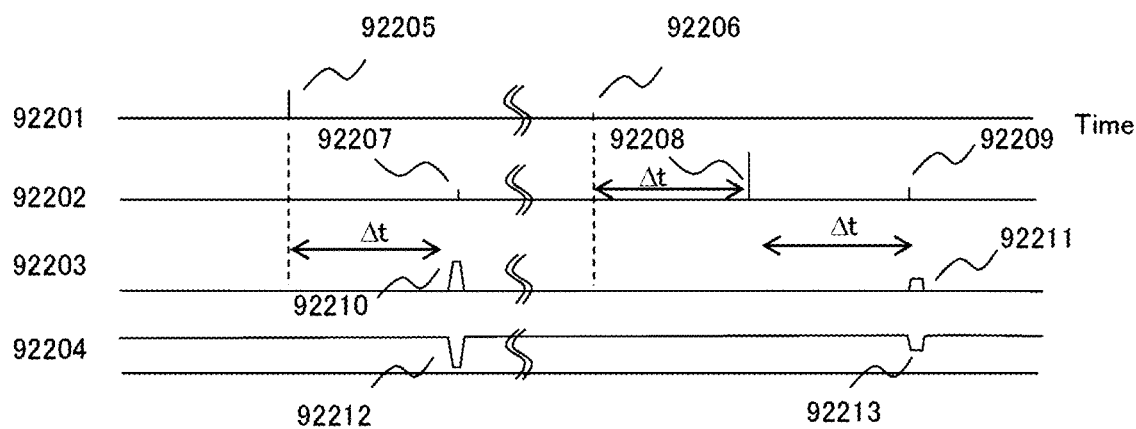

[FIG. 23]
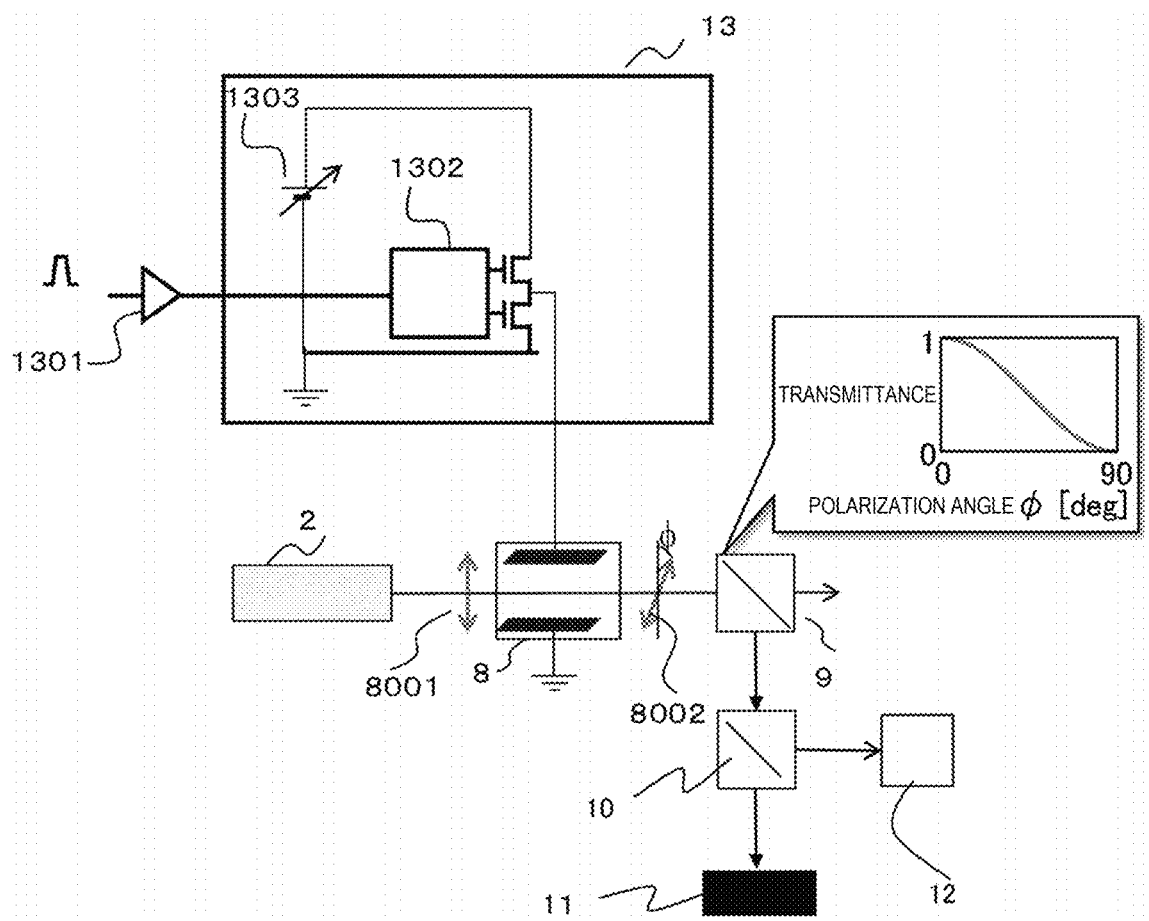

[FIG. 24]
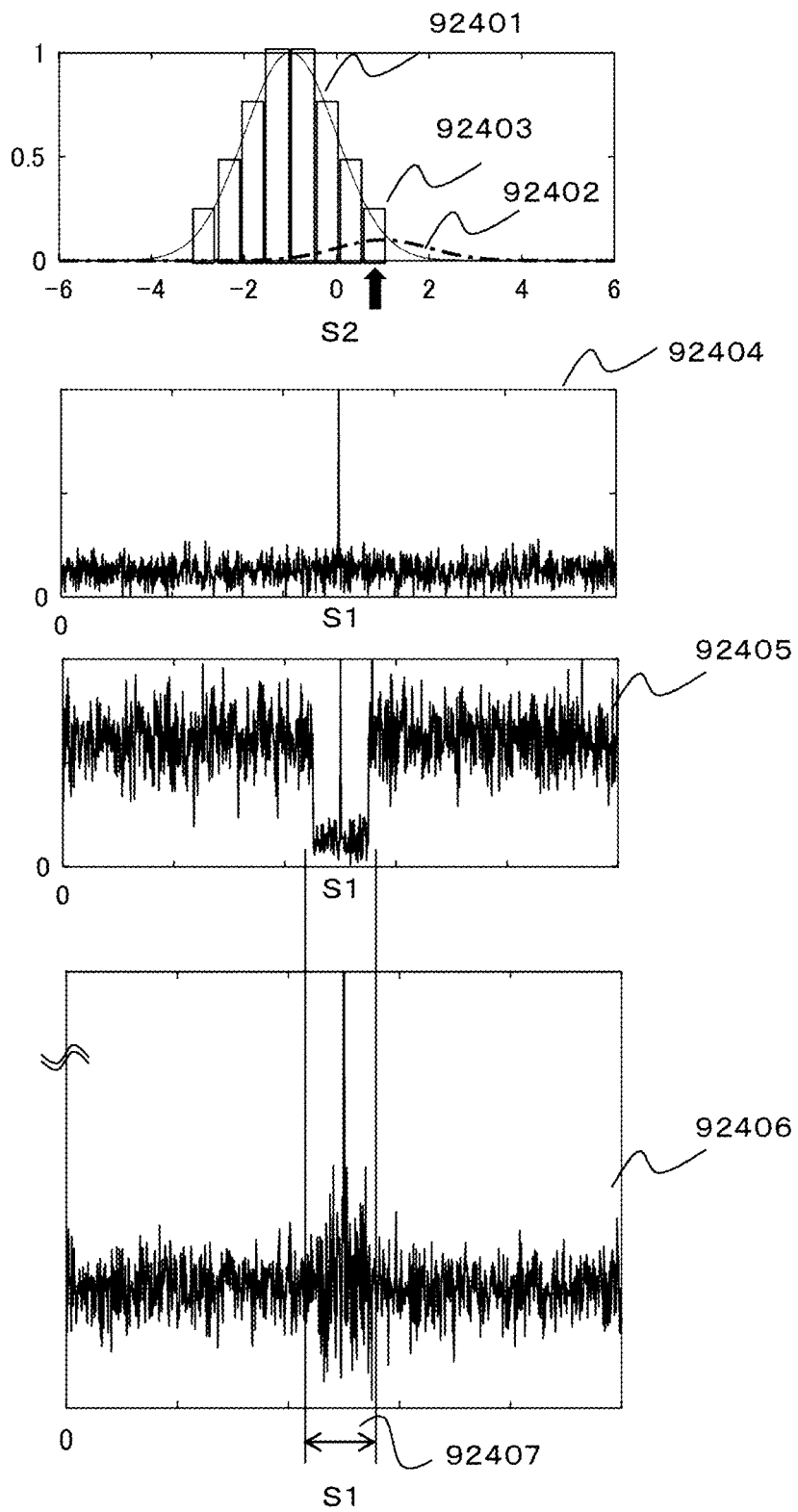

[FIG. 25]
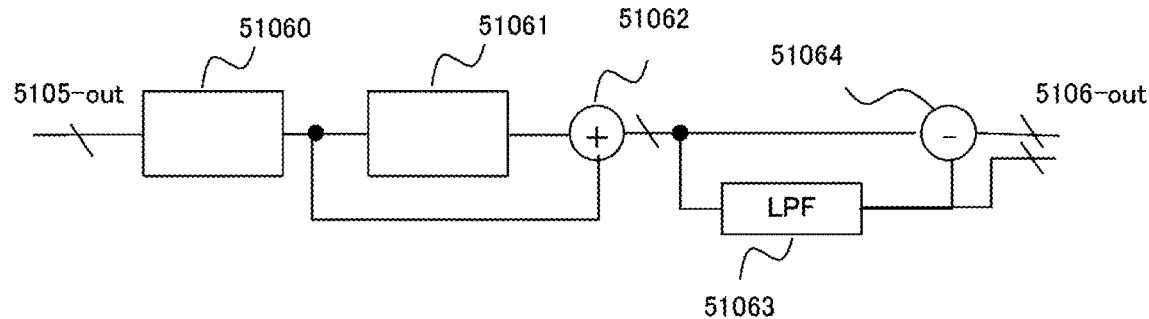
[FIG. 26]
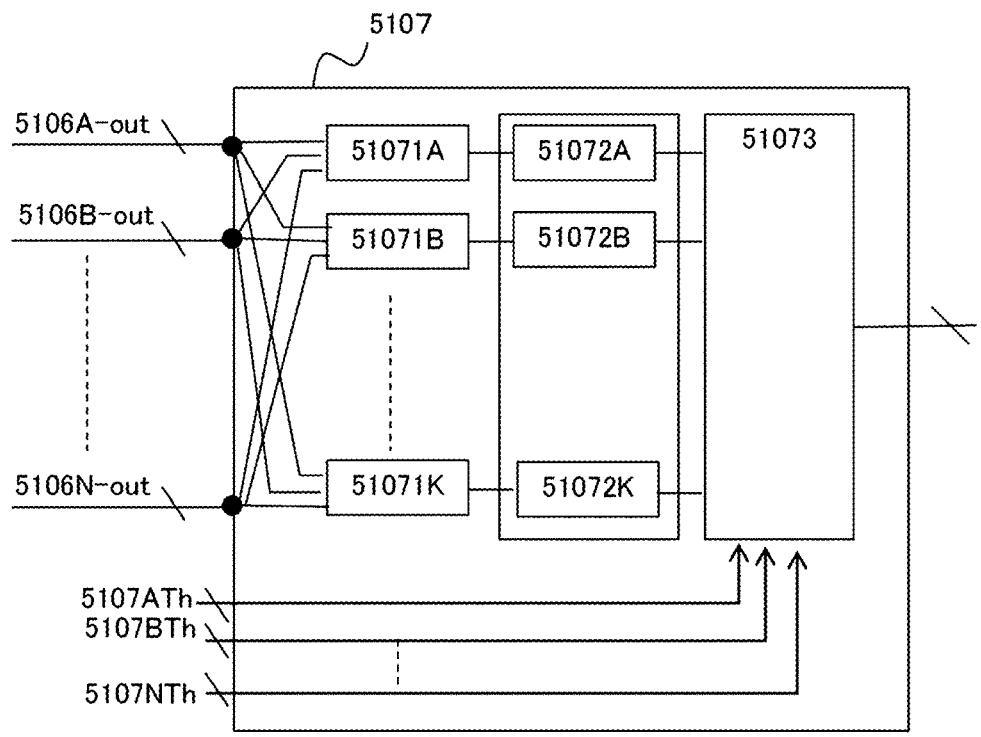

[FIG. 28]
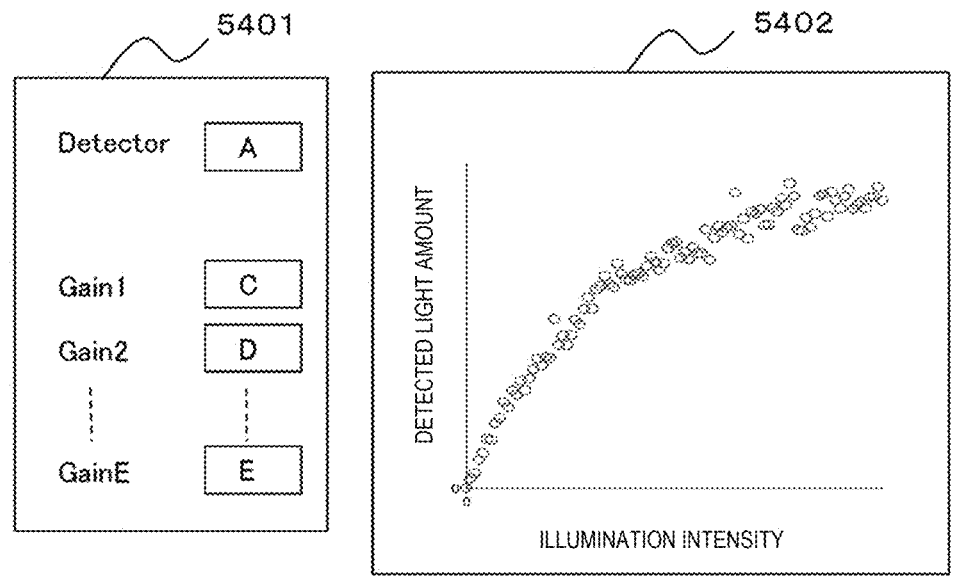
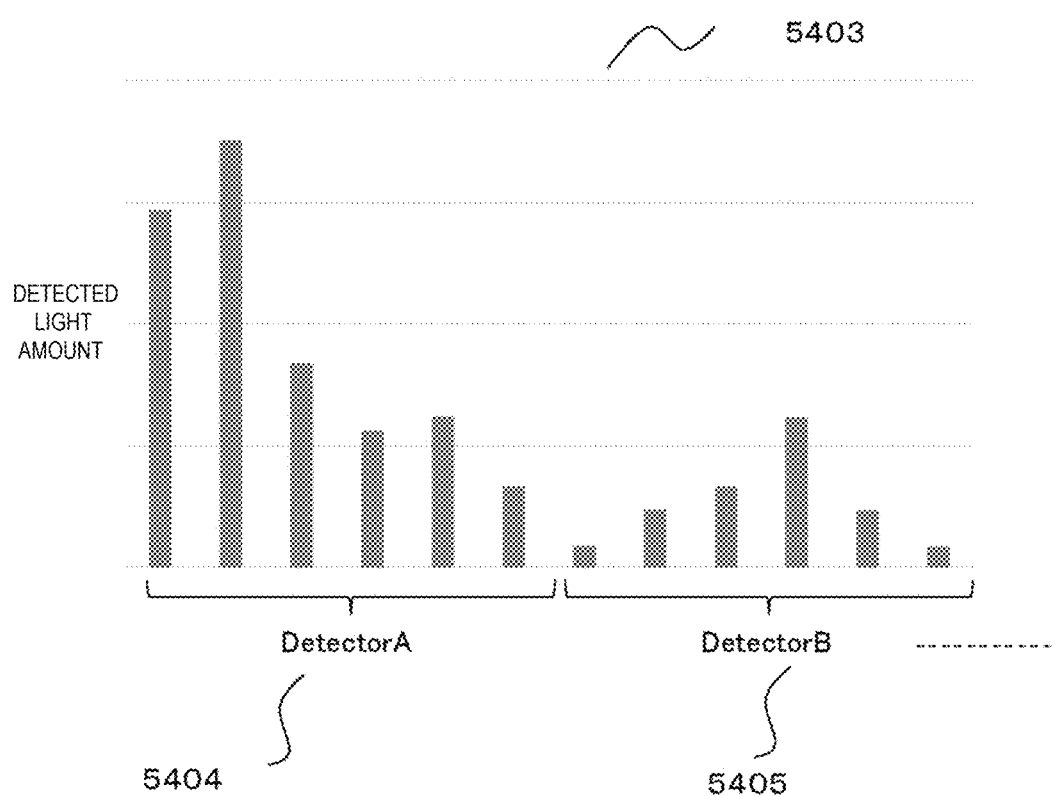

[FIG. 29]
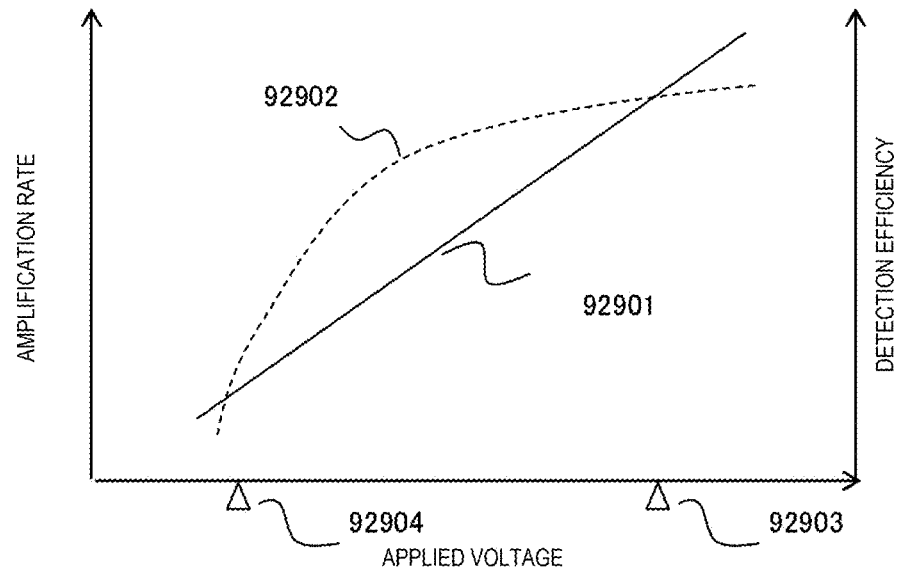
[FIG. 30]
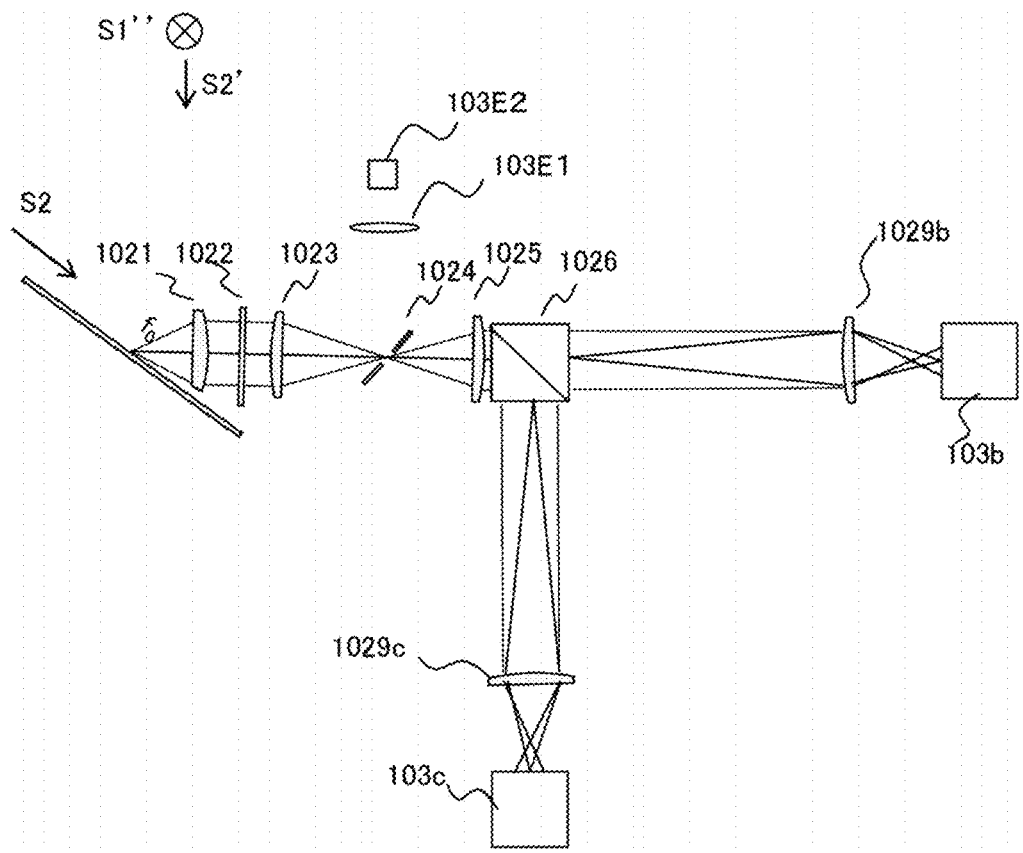

[FIG. 31]
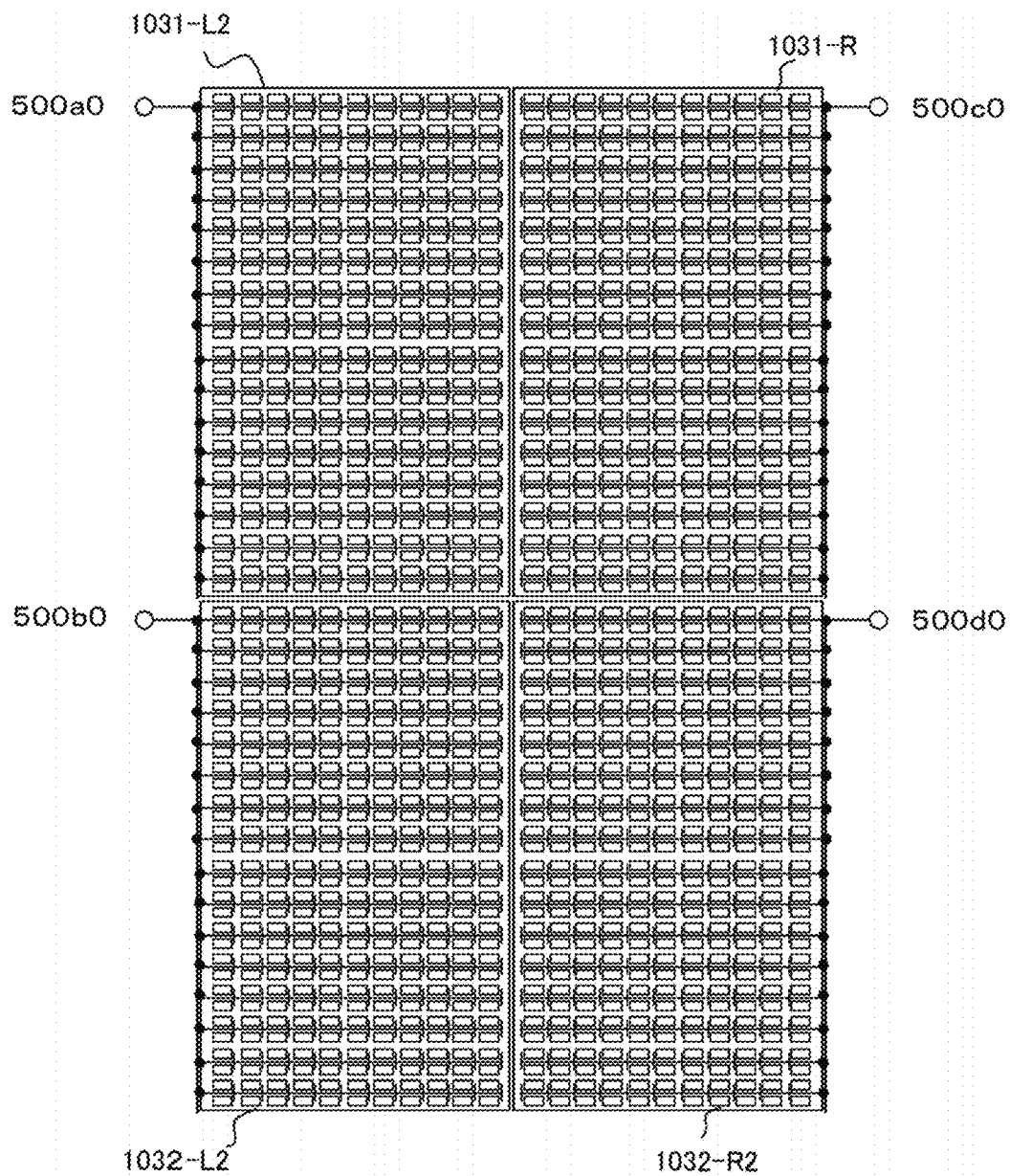

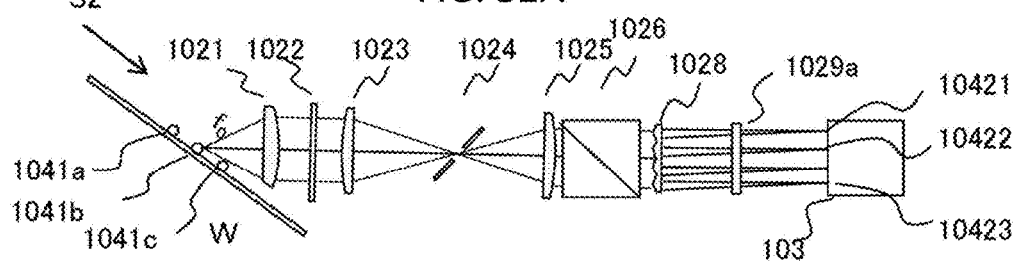
FIG. 32A
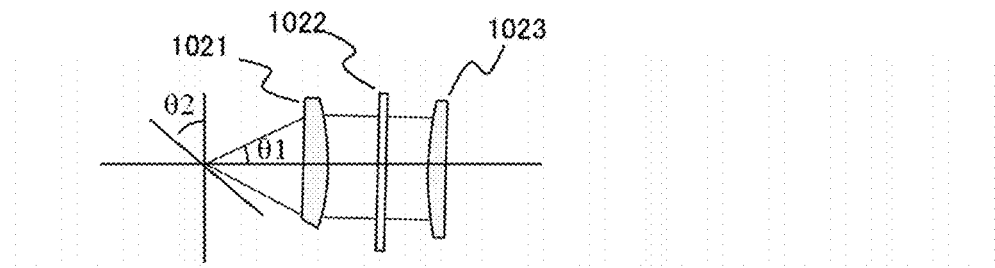
FIG. 32B
[FIG. 33]
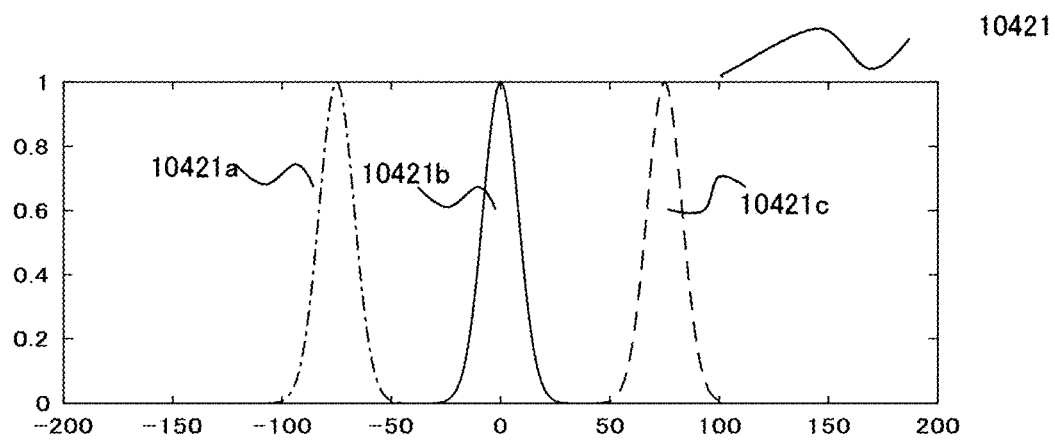

[FIG. 34]
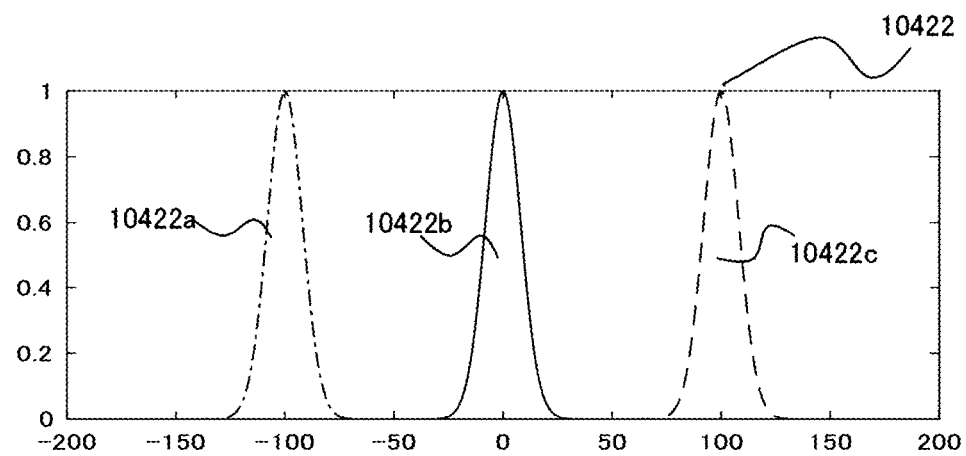
[FIG. 35]
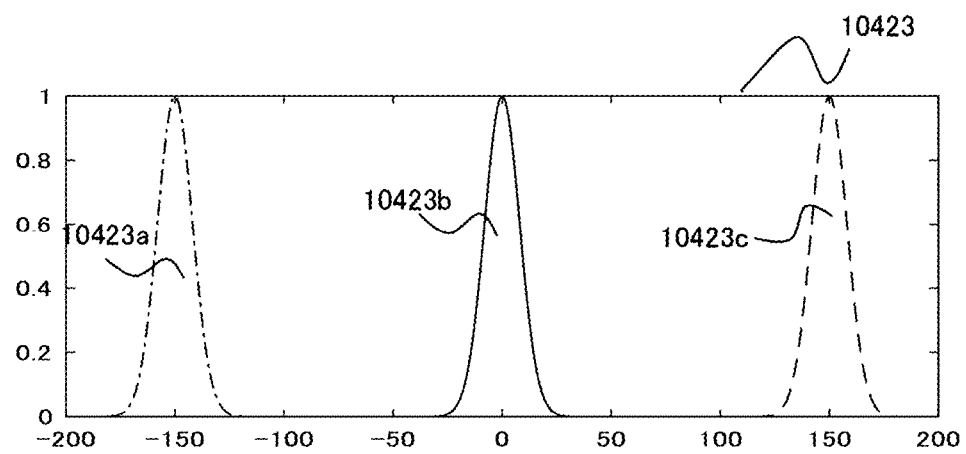

DEFECT INSPECTION DEVICE

TECHNICAL FIELD

The present invention relates to a defect inspection device.

BACKGROUND ART

In a manufacturing line such as a semiconductor substrate, a thin film substrate, defects existing on a surface of the semiconductor substrate, the thin film substrate, or the like are inspected in order to maintain and improve a yield of a product.

In the semiconductor substrate, as a circuit pattern to be formed is miniaturized, a defect size that affects the yield of the product is also miniaturized, and accordingly, it is necessary to improve sensitivity of an inspection device. In defect inspection by an optical inspection device, reflected light from the defect is detected and inspected, and a reflected light amount is proportional to about a sixth power of the defect size.

Since detectable reflected light amount drastically decreases when the defect size is miniaturized, it is essential to improve sensor gain of a detector that detects the reflected light and power density of illumination in order to achieve a high-speed inspection for detecting a fine defect.

However, if the sensor gain of the detector and the power density of the illumination are improved, saturation of a detection signal of a relatively large defect is caused, and characteristics of the defect cannot be normally measured.

In general, the larger the size of the defect, the greater the impact on the quality of the product. It is difficult to estimate the size of the defect or classify the defect based on far field distribution of defect reflected light if the defect reflected light is saturated. Therefore, it is required to detect both a minute defect and a relatively large defect in defect inspection.

In PTL 1, detection of the minute defect is achieved by using a fact that a photoelectron-multiplier tube realizes a high current amplification. In the method, the inspection is performed by switching to an intermediate dynode current in order to avoid anode saturation of the photoelectron-multiplier tube caused by the reflected light from a large defect.

CITATION LIST

Patent Literature

PTL 1: JP-T-2009-501902

SUMMARY OF INVENTION

Technical Problem

In PTL 1, the photoelectron-multiplier tube capable of realizing high current amplification is used in order to detect the minute defect. Further, for the relatively large defect, a defect inspection is performed by obtaining a defect reflected light signal using an intermediate dynode current, and the saturation in a sensor is prevented.

However, the photoelectron-multiplier tube generally has a large light-receiving area and cannot be detected in parallel. Therefore, it is difficult to detect imaging in the photoelectron-multiplier tube, and a relative positional relationship between a laser irradiation position and a large defect cannot be grasped.

As a result, it is difficult to determine whether the defect is a relatively small defect in a main part of the laser beam power or a relatively large defect detected in the vicinity of a base of the laser having a Gaussian illumination power density.

An object of the present invention is to detect both a minute defect and a relatively large defect in a defect inspection device.

Solution to Problem

A defect inspection device according to an aspect of the present invention includes a pulse oscillated light source, an illumination unit that guides light output from the light source to a sample, a scanning unit that controls a position at which the sample is scanned by the illumination unit, a light converging unit that converges light reflected from the sample, a first photoelectric conversion unit that outputs an electric signal corresponding to the light converged by the light converging unit, an AD conversion unit that converts the electric signal output from the first photoelectric conversion unit into a digital signal in synchronization with pulse oscillation of the light source, a linear restoration unit that processes a digital signal converted by the AD conversion unit in synchronization with a pulse oscillation output by the AD conversion unit and corrects nonlinearity of the first photoelectric conversion unit, a defect detection unit that detects a defect of the sample based on an output of the linear restoration unit, and a processing unit that obtains and outputs a position and a size of the defect detected by the defect detection unit.

Advantageous Effect

According to an aspect of the present invention, both a minute defect and a relatively large defect can be detected in the defect inspection device.

BRIEF DESCRIPTION OF DRAWINGS

FIG. 1 is an overall schematic configuration diagram showing a defect inspection device.

FIG. 2 is a diagram showing an illumination distribution pattern and a scanning direction on a sample surface.

FIG. 3 is a diagram showing a trajectory of an illumination spot by scanning.

FIG. 4 is a view of an arrangement of a detection unit and detection directions as viewed from a side.

FIG. 5 is a view of an arrangement of a low-angle detection unit and detection directions as viewed from above.

FIG. 6 is a view of an arrangement of a high-angle detection unit and detection directions as viewed from above.

FIG. 8 is a diagram showing a configuration of a photoelectric conversion unit.

FIG. 9 is a diagram showing a configuration of the detection unit.

FIG. 10 is a diagram showing a configuration of an aperture of the detection unit.

FIG. 13 is a diagram showing a position and a profile of the illumination spot.

FIG. 14 is a diagram showing an illumination intensity control unit of the photoelectric conversion unit.

FIG. 15 is a diagram showing an equivalent circuit of configuration components of the photoelectric conversion unit.

FIG. 16 is an explanatory view of a saturation problem of the sensor.

FIG. 17 is a diagram showing input and output characteristics of the sensor.

FIG. 18 is a diagram showing an output from the sensor obtained by the input and output characteristics of the sensor.

FIG. 19 is a diagram showing a non-linear restoration of the detection unit.

FIG. 20 is a diagram showing a configuration of a data processing unit.

FIG. 21 is a diagram showing a configuration of the data processing unit.

FIG. 22 is a diagram showing a timing chart of laser intensity control and sensor gain control.

FIG. 23 is a diagram showing a laser intensity control unit.

FIG. 24 is a diagram showing a sensor output signal measured when the laser intensity control is performed.

FIG. 25 is a diagram showing a configuration of the data processing unit.

FIG. 26 is a diagram showing a configuration of the data processing unit.

FIG. 28 is a diagram for calculating a profile of the linear restoration table.

FIG. 29 is a diagram showing an amplification rate and a detection efficiency with regard to an applied voltage of the sensor.

FIG. 30 is a diagram showing a configuration of a detection optical system.

FIG. 31 is a diagram showing the photoelectric conversion unit.

FIGS. 32A and 32B are diagrams showing a configuration of the detection unit.

FIG. 33 is a diagram showing an intensity profile of an image formed by the detection unit.

FIG. 34 is a diagram showing an intensity profile of the image formed by the detection unit.

FIG. 35 is a diagram showing an intensity profile of the image formed by the detection unit.

DESCRIPTION OF EMBODIMENTS

Figure 7A:
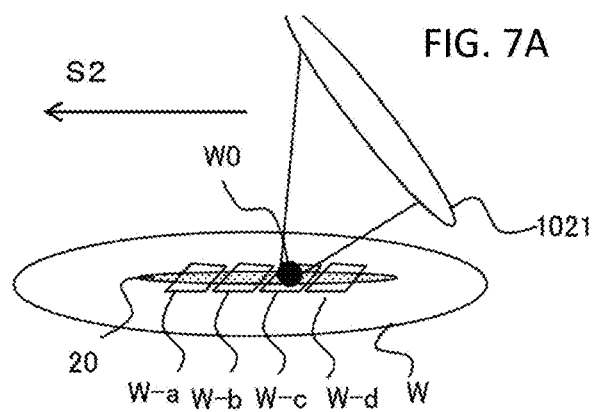
FIGS. 7A and 7B are diagrams showing an illumination distribution pattern and an imaging direction on a sample surface.

In a defect inspection used in a manufacturing process of a semiconductor or the like, steps of detecting a minute defect, measuring a size of the detected defect with high accuracy, inspecting a sample in a nondestructive manner, obtaining substantially constant inspection results regarding, for example, the number, the position, the size, and the defect type of detected defects when inspecting the same sample, and inspecting a large number of samples within a certain period of time, are required.

It is required to improve sensitivity degree of the inspection device in response to the weakening of the intensity of scattered light from the minute defect. In response to this, an increase in illumination power density and a multiplication of a current amplification rate of a sensor are performed. As a result, in a relatively large defect, a decrease in a detected light amount which exceeds a detection range of the sensor occurs, and position measurement accuracy of the defect and measurement accuracy of the defect size are deteriorated.

Embodiments provide a defect inspection device that detects both minute defects and relatively large defects.

For example, in an embodiment, the sample is irradiated with a pulsed laser, and a photoelectric conversion unit is disposed at an imaging position of a light converging unit that converges the reflected light. Then, after a light amount detected by the photoelectric conversion unit is sampled in synchronization with light emission timing of the pulsed laser, nonlinearity of the photoelectric conversion unit in the light amount is corrected. After the correction, data obtained by correcting output fluctuation of the photoelectric conversion unit due to an illumination light amount of a laser, a multiplication rate and the detection efficiency of the photoelectric conversion unit is processed, the defect is inspected, the defect size is estimated, and a defect position is measured. Accordingly, both of the sensitivity and estimation accuracy of the defect size and the position can be improved.

Hereinafter, embodiments will be described with reference to drawings.

First Embodiment

A configuration of a defect inspection device according to the first embodiment will be described with reference to FIG. 1.

As shown in FIG. 1, the defect inspection device includes an illumination unit 101, a detection unit 102, photoelectric conversion units 103, 103E, a stage 104 on which a sample W can be placed, signal processing units 51, 52 for detecting defects, a control unit 53, a display unit 54, and an input unit 55.

The illumination unit 101 appropriately includes a laser light source 2, an attenuator 3, an emission light adjustment unit 4, a beam expander 5, a polarization control unit 6, an illumination intensity distribution control unit 7, an electro-optical element 8, a polarization beam splitter 9, a beam splitter 10, a beam diffuser 11, a photoelectric converting device 12, and a polarization voltage control unit 13. A laser light beam emitted from the laser light source 2 is adjusted to have a desired beam intensity by the attenuator 3, adjusted to reach a desired beam position and travel in a desired beam travel direction by the emission light adjustment unit 4, and adjusted to have a desired beam diameter by the beam expander 5.

A pockels cell is typically used as the electro-optical element 8. The electro-optical element 8 controls a polarization direction of light input from the beam expander 5 according to a control voltage input from the polarization voltage control unit 13. The polarization beam splitter 9 separates incident light according to the polarization direction. A combination of the electro-optical element 8 and the polarization beam splitter 9 controls a light amount incident on the polarization control unit 6. The light is adjusted into a desired polarization state by the polarization control unit 6, and further adjusted into a desired intensity distribution by the illumination intensity distribution control unit 7, so as to illuminate an inspection target area of the sample W.

An incident angle of illumination light relative to a sample surface is controlled by a position and an angle of a reflecting mirror of the emission light adjustment unit 4 disposed in an optical path of the illumination unit 101. The incident angle of the illumination light is set to an angle suitable for detecting the minute defect. Detection of the minute defect is suitable since the larger the illumination incident angle, that is, the smaller an illumination elevation angle (an angle between the sample surface and an illumination optical axis), the weaker scattered light (called haze) from minute unevenness on the sample surface, which is noise to scattered light from a minute foreign object on the sample surface.

Therefore, when the scattered light from the minute unevenness of the sample surface interferes with the detection of the minute defect, the incident angle of the illumination light is preferably set to 75 degrees or more (15 degrees or more in terms of the elevation angle). On the other hand, in oblique incident illumination, the smaller the illumination incident angle, the larger the absolute amount of scattered light from the minute foreign object. Therefore, when shortage of a scattered light amount from a defect interferes with the detection of the minute defect, the incident angle of the illumination light is preferably set to 60 degrees or more and 75 degrees or less (15 degrees or more and 30 degrees or less in terms of the elevation angle).

When the oblique incident illumination is performed, scattered light from a defect on the sample surface increases compared with other polarized light by setting polarized light for illumination to p-polarized light by polarization control in the polarization control unit 6 of the illumination unit 101. When the scattered light from the minute unevenness of the sample surface interferes with the detection of the minute defect, scattered light from the minute unevenness of the sample surface decreases compared with the other polarized light by setting the polarized light for illumination to s-polarized light.

For the laser light source 2, a high output laser light source that oscillates an ultraviolet or vacuum ultraviolet laser beam having a short wavelength (equal to or less than a wavelength of 355 nm) as a wavelength difficult to penetrate an inside of the sample and outputs the laser beam of 2 W or more is used for detecting a minute defect in the vicinity of the sample surface. An emission beam diameter is about 1 mm. A laser light source that oscillates a visible or infrared laser beam having a wavelength easy to penetrate the inside of the sample is used for detecting a defect inside the sample.

The attenuator 3 appropriately includes a first polarizing plate, a ½ wavelength plate rotatable around an optical axis of the illumination light, and a second polarizing plate. The light incident on the attenuator 3 is converted to linearly polarized light by the first polarizing plate, a polarization direction is rotated to any direction according to an azimuth angle of a phase lag axis of the ½ wavelength plate, and the light passes through the second polarizing plate. A light intensity is dimmed at any ratio by controlling the azimuth angle of the ½ wavelength plate. The first polarizing plate is not necessarily required when a linear polarization degree of light incident on the attenuator 3 is sufficiently high.

As the attenuator 3, the one for calibrating a relationship between an input signal and a dimming rate beforehand is used. As the attenuator 3, an ND filter having a gradated density distribution and a plurality of ND filters having mutually different densities can be used by switching.

The emission light adjustment unit 4 includes a plurality of reflecting mirrors. Here, an embodiment in which the emission light adjustment unit 4 is configured with two reflecting mirrors will be described. However, the invention is not limited thereto, and three or more reflecting mirrors may also be appropriately used. Here, a three-dimensional rectangular coordinate system (XYZ coordinates) is provisionally defined, and it is assumed that light incident on the reflecting mirror travels in a +X direction.

A first reflecting mirror is installed such that incident light is deflected in a +Y direction (which means the incidence and reflection of light occurs in an XY plane). A second reflecting mirror is installed such that the light reflected on the first reflecting mirror is deflected in a +Z direction (which means the incidence and reflection of light occurs in a YZ plane). A position and a traveling direction (angle) of light emitted from the emission light adjustment unit 4 are adjusted by parallel movement and an adjustment of a tilt angle of each reflecting mirror. As described above, an incidence and reflection surface (XY plane) of the first reflecting mirror is orthogonal to an incidence and reflection surface (YZ plane) of the second reflecting mirror. Accordingly, an adjustment of a position and an angle on an XZ plane and an adjustment of a position and an angle on the YZ plane of light (traveling in the +Z direction) emitted from the emission light adjustment unit 4 can be independently performed.

The beam expander 5 includes two or more groups of lens, and has a function of magnify a diameter of incident parallel light beams. For example, a Galileo beam expander including a combination of a concave lens and a convex lens is used. The beam expander 5 is installed on a translation stage having two or more axes, and the position can be adjusted such that a predetermined beam position and the center are coincident.

The beam expander 5 has a function of adjusting a tilt angle of the entire beam expander 5 such that an optical axis of the beam expander 5 and a predetermined beam optical axis are coincident. A magnification rate of a diameter of a light beam can be controlled by adjusting an interval between the lenses (zoom mechanism).

When light incident on the beam expander 5 is not parallel, the magnification of the diameter of the light beam and collimation (quasi-parallelization of a light beam) are simultaneously performed by adjusting the interval between the lenses. The collimation of the light beam may be performed by installing a collimator lens on an upstream side of the beam expander 5 independent from the beam expander 5. A magnification rate of a beam diameter caused by the beam expander 5 is about 5 to 10 times, and a beam emitted from the light source and having a beam diameter of 1 mm is magnified to about 5 mm to 10 mm.

The polarization control unit 6 is configured with the ½ wavelength plate and a ¼ wavelength plate, and controls the polarization state of the illumination light to any polarization state. On the way of the optical path of the illumination unit 101, a state of light incident on the beam expander 5 and a state of light incident on the illumination intensity distribution control unit 7 are measured by a beam monitor 22.

The illumination intensity distribution control unit 7 includes an optical element such as an aspherical lens, a diffractive optical element, a cylindrical lens array, a light pipe, and the like, and controls a light amount distribution of illumination on the surface of the sample W.

When the oblique incident illumination is performed, a displacement of the position of an illumination intensity distribution and a disturbance of the illumination intensity distribution due to defocus occur due to a height displacement of a sample surface. In order to prevent this case, the height of the sample surface is measured, and when the height is deviated, a deviation is corrected by the height adjustment with the illumination intensity distribution control unit 7 or a Z axis of the stage 104.

An illuminance distribution shape (an illumination spot 20) formed on the sample surface by the illumination unit 101 and a sample scanning method will be described with reference to FIGS. 2 and 3.

A circular semiconductor silicon wafer is assumed as the sample W. The stage 104 includes the translation stage, a rotation stage, and a Z stage (none is shown) for adjusting a height of the sample surface.

The illumination spot 20 has a illumination intensity distribution long in one direction as described above. This direction is defined as S2, and a direction substantially orthogonal to S2 is defined as S1. Scanning is performed in the circumferential direction S1 of a circle having a rotation axis of the rotating stage in the center by a rotation motion of the rotating stage and in the translational direction S2 of the translation stage by a translational motion of the translation stage. Scanning is performed in the scanning direction S2 by only a distance equal to or less than a length of the illumination spot 20 in a longitudinal direction while the sample is rotated once by scanning in the scanning direction S1. Accordingly, the illumination spot 20 draws a spiral trajectory T on the sample W, and an entire surface of the sample 1 is scanned. The illumination spot 20 typically has a Gaussian distribution profile in the S2 direction.

A plurality of detection units 102 are arranged to detect scattered light in a plurality of detection directions generated from the illumination spot 20.

An arrangement example of the detection units 102 relative to the sample W and the illumination spot 20 will be described with reference to FIGS. 4 to 6.

FIG. 4 shows a side view of an arrangement of the detection units 102. An angle between a detection direction (center direction of detection aperture) by the detection unit 102 and a normal line of the sample W is defined as a detection zenith angle. The detection unit 102 includes high-angle detection units 102$h$ each having a detection zenith angle of 45 degrees or less and low-angle detection units 102$l$ each having a detection zenith angle of 45 degrees or more.

Each of the high-angle detection units 102$h$ and the low-angle detection units 102$l$ includes a plurality of detection units in a manner of covering the scattered light scattered in multiple directions at each detection zenith angle.

FIG. 5 shows a plan view of an arrangement of the low-angle detection units 102$l$. An angle formed by a traveling direction of the oblique incident illumination and the detection direction in a plane parallel to the surface of the sample W is defined as a detection azimuth angle. The low-angle detection unit 102 appropriately includes a low-angle front detection unit 102$lf$, a low-angle side detection unit 102$ls$, a low-angle rear detection unit 102$lb$, and a low-angle front detection unit 102$lf'$, a low-angle side detection unit 102$ls'$ and a low-angle rear detection unit 102$lb'$ positioned symmetrically with the former detection units with respect to an illumination incident surface.

For example, the low-angle front detection unit 102$lf$ is set at a detection azimuth angle of equal to or more than 0 degree and equal to or less than 60 degrees. The low-angle lateral side detection unit 102$ls$ is set at a detection azimuth angle of 60 degrees or more and 120 degrees or less. The low-angle rear detection unit 102$lb$ is set at a detection azimuth angle of 120 degrees or more and 180 degrees or less.

FIG. 6 shows a plan view of an arrangement of the high-angle detection units 102$h$. The high-angle detection unit 102 appropriately includes a high angle front detection unit 102$hf$, a high angle side detection unit 102$hs$, a high angle rear detection unit 102$hb$, and a high angle side detection unit 102$hs'$ positioned at a symmetrical position to the high angle side detection unit 102$hs$ with respect to the illumination incident surface. For example, the high angle front detection unit 102$hf$ is set at a detection azimuth angle of 0 degree or more and 45 degrees or less. The high-angle rear side detection unit 102$b$ is set at a detection azimuth angle of 135 degrees or more and 180 degrees or less. Although the case where four high-angle detection units 102$h$ and six low-angle detection units 102$l$ exist is shown here, the invention is not limited thereto, and the number and positions of the detection units may be changed appropriately.

Figure 7B:
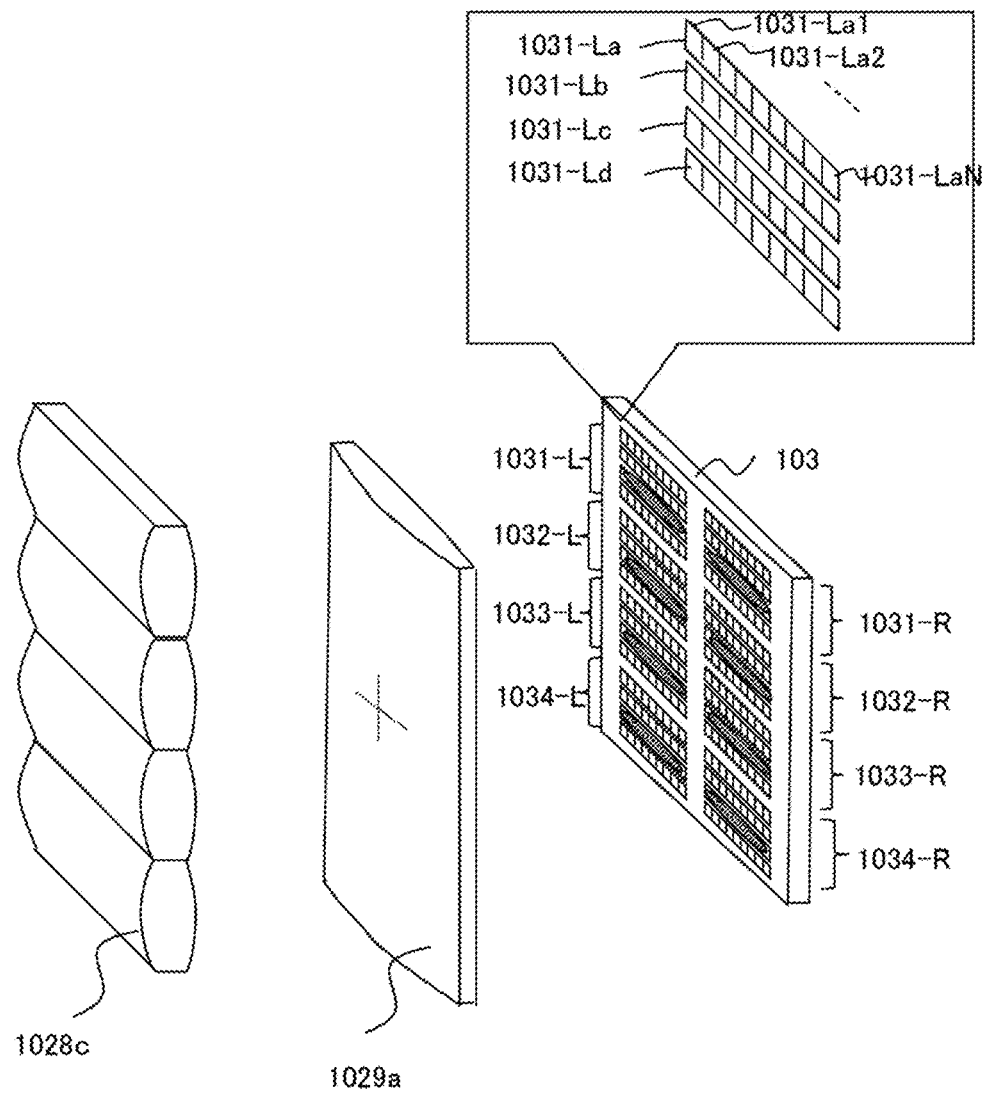

FIGS. 7A and 7B show a schematic diagram of the illumination spot 20 on the sample W and a correspondence of the imaging from 1028$c$ to 103.

The illumination spot 20 elongates in the S2 direction of FIG. 7A. W0 indicates a defect to be detected. The photoelectric conversion unit 103 divides the illumination spot into W-a to W-d and detects the divided illumination spots. Here, the illumination spot is divided into four parts, but the invention is not limited to this number. The present invention can be embodied by setting the number of divisions to any integer.

The scattered light from W0 is converged by an objective lens 102$l$ and guided to the photoelectric conversion unit 103. The 1028$c$ is a cylindrical lens array configured with cylindrical lenses that form an image only in one direction. Pixel block sets 1031, 1032, 1033, and 1034 corresponding to the cylindrical lenses formed in the lens array of 1028 are formed in the photoelectric conversion unit 103. Each of the pixel block sets is divided into two blocks: an L side block and an R side block.

Pixel blocks of positions 1031-L to 1034-L and 1031-R to 1034-R can be arranged close to each other since an area in which a light amount is weak and the photoelectric conversion cannot be performed is shielded by an aperture 1024 shown in FIG. 1. Only light at a specific position of a pupil of the objective lens is transmitted to the cylindrical lenses formed in the lens array of the 1028$c$. Accordingly, an image is formed for each divided pupil area, and an image formed by the 1028$c$ has an effect equivalent to narrowing of the opening. As a result, a depth of focus increases.

Accordingly, the imaging can be detected even in a direction not orthogonal to S2. 1029$a$ is a cylindrical lens, and an image of the pupil of the objective lens 102$l$ is formed in a direction orthogonal to the imaging direction of the lens array of 1028$c$. Accordingly, in a light receiving portion of the photoelectric conversion unit 103, an image of an illumination spot portion is formed in the S2 direction, and an image of a pupil portion of 102$l$ is formed in the direction orthogonal to S2.

In each pixel block, a photoelectric element is formed in a two-dimensional shape. First, a pixel block of 1031-L will be described.

1031-La to 1031-Ld are pixel groups formed in the pixel block of the pixel block 1031-L, and cause light from sections W1 to W4 at a position of the illumination spot to form images, respectively. 1031-La1 to 1031-LaN are pixels belonging to 1031-La, and each pixel outputs a predetermined current when a photon is incident.

The outputs of the pixels belonging to the same pixel group are electrically connected, and one pixel group outputs a sum of current outputs of the pixels belonging to the pixel group.

Similarly, 1032-L to 1034-L also output pixels corresponding to W-a to W-d. Finally, the output corresponding to the same section from a separate pixel group is electrically connected, and the photoelectric conversion unit 103 performs an output corresponding to the number of photons detected from each of the sections W1 to W4.

FIG. 8 shows a detailed pattern of the photoelectric conversion unit 103.

Although a configuration of four pixel block sets is illustrated in FIGS. 7A and 7B, a configuration of eight pixel block sets is illustrated in FIG. 8. At the time, the number of cylindrical lenses constituting the corresponding lens array of 1028*c* becomes eight correspondingly. In this way, the number of pixel block sets can be set to any number. The eight pixel blocks of 1031-L to 1034-L and 1031-R to 1034-R are divided into four pixel block groups.

That is, "1031-L, 1032-L", "1033-L, 1034-L", "1031-R, 1032-R", and "1033-R, 1034-R". The pixel blocks belonging to the same pixel block group are electrically connected between corresponding pixel groups, and are not connected between different pixel block groups. In the first embodiment, the illumination spot is divided into eight areas W-a to W-h, and the number of pixel block groups is four, so that a total of 32 outputs are obtained.

That is, the pixel block groups of "1031-L, 1032-L" output currents corresponding to photons detected at 500*a*-1 to 500*h*-1 by electrically connecting outputs of the pixel groups that form images of the same divided area of the illumination spot 20. Similarly, "1033-L, 1034-L" output currents corresponding to photons detected at 500*a*-2 to 500*h*-2. "1031-R, 1032-R" output currents corresponding to photons detected at 500*a*-3 to 500*h*-3. "1033-R, 1034-R" output currents corresponding to photons detected at 500*a*-4 to 500*h*-4.

A more specific configuration diagram of the detection unit 102 is shown in FIG. 9.

The scattered light generated from the illumination spot 20 is converged by an objective lens 1021, and a polarization direction is controlled by a polarization control filter 1022. A ½ wavelength plate whose rotation angle can be controlled by a drive mechanism such as a motor is applied as the polarization control filter 1022. A detection NA of the objective lens 1021 is preferably 0.3 or more in order to efficiently detect the scattered light. In a case of a low-angle detection unit, a lower end of the objective lens 1201 is cut off as necessary such that the lower end of the objective lens 1021 does not interfere with the a sample surface W.

An imaging lens of 1023 forms an image of the illumination spot 20 at the position of 1024. Here, S2' corresponds to a vector obtained by removing components correlated with the optical axes of the objective lens 1021 and the imaging lens 1023 from a direction vector of S2, and S1" is a direction orthogonal to both the optical axis and S2'. 1024 is an aperture that is set to pass only the light in an area to be detected by the photoelectric conversion unit 103 among formed images of the beam spot 20.

FIG. 10 shows a structure of the aperture. 10241 is an opening portion through which light passes. The opening portion 10241 passes only a central portion having a large light amount in the S2 direction in the Gaussian distribution of the illumination spot, and shields an area where the light amount in a beam end is small. An outer disturbance such as air scattering which occurs when the illumination transmits through air is prevented by setting the formed image of the illumination spot 20 in the direction S1 to the same size. 10242 is a reflection portion.

The reflection portion 10242 is disposed on the side where the sample W moves in the S2 direction in the next round in relation to the center of view although the sample W is spirally scanned as shown in FIG. 3. Light reflected by the reflection portion 10242 is converged by a light converging unit 103E1 shown in FIG. 9 and detected by a photoelectric converting device 103E2. A sensor that realizes high current amplification, such as typically a silicon photomultiplier (SiPM) or a photomultiplier tube (PMT), is applied to the photoelectric converting device 103E2. A signal detected by the photoelectric converting device 103E2 is transmitted to the control unit 53. Light detected by the photoelectric converting device 103E2 manifests reflected light from a defect in the vicinity of a base of the Gaussian distribution of the illumination spot.

The image of the illumination spot 20 formed on the aperture 1024 is inclined with respect to the optical axis since the optical axes of the objective lens 1021 and the imaging lens 1023 are not orthogonal to the S2 direction. Typically, an imaging magnification is set such that the image of the aperture 1024 is inclined by 45 degrees with respect to the optical axis. Assuming that an angle between the optical axis and the sample surface is $\theta$, when the imaging magnification is $\tan \theta$, the image formed in the aperture 1024 forms an angle of 45 degrees with respect to the optical axis. By setting the angle to $\theta$, the light reflected by the reflection portion 10242 can be easily guided to the light converging unit 103E1.

Light in a desired area can be detected by the photoelectric converting device 103E2 since the opening 10241 is placed on a plane conjugate with the sample surface. Light that has passed through the aperture 1024 is converged again by a converging lens 1025, and the optical path is branched by the polarization direction with a polarization beam splitter 1026. In the first embodiment, light of one polarization component is absorbed by a diffuser 1027. For example, the polarization control filter 1022 may be a wire grid polarizing plate having a transmittance of 80% or more, and only light in a desired polarization direction can be extracted without using the polarization beam splitter 1026 and the diffuser 1027.

1028*a* to 1028*c* are cylindrical lens arrays, and a plurality of images of the beam spot 20 are formed on the photoelectric conversion unit 103. The cylindrical lens array 1028*a* is disposed at a position optically conjugate with the pupil of the objective lens 1021. An image of the illumination spot 20 on the photoelectric conversion unit 103 formed by the cylindrical lens arrays 1028*a* to 1028*c* is an image of detection light converged in the area in the corresponding pupil. The cylindrical lens array 1028*a* and the cylindrical lens array 1028*b* are lens arrays for magnification adjustment, and the cylindrical lens array 1028*c* is a lens array for imaging. The cylindrical lens array 1028*a* and the cylindrical lens array 1028*b* are Kepler type magnification adjustment mechanisms. Although the Kepler type magnification adjustment mechanisms are used here, the present invention is not limited thereto, and other adjustment mechanisms such as a Galileo magnification adjustment mechanism may be used.

In a configuration in which the cylindrical lens array 1028*a* and the cylindrical lens array 1028*b* are not provided, only the cylindrical lens array 1028*c* generates a magnification error in each image formed by the lens array 1028. This point will be described with reference to FIGS. 32(*a*) and 32(*b*).

In FIGS. 32A and 32B, unlike FIG. 9, the cylindrical lens array is constituted only by 1028. Here, an angle formed between a light beam incident on the objective lens 1021 and the optical axis is defined as θ1. An angle formed between the sample W and the optical axis is defined as θ2. Here, it is assumed that θ1 passes through a center of one lens among the lenses constituting the lens array 1028 at a position where the pupil of the objective lens 1021 is relayed. An angle formed between the light beam and the sample surface is represented by θ3, which is represented by the following Formula 1.

[Math 1]

$$\sin θ3 = (1-((-\cos θ1-\sin θ1)(-\sin θ2 \cos θ2)^T)^2)^{0.5} \quad \text{(Formula 1)}$$

Images formed on positions 10421 to 10423 of a light receiving surface of the photoelectric conversion unit 103 have a size proportional to sin θ3 (i) that is calculated from a direction θ1 (i) of a principal light beam incident on a lens i of 1028c to form an image.

FIGS. 33 to 35 show intensity profiles of images of a spherical body with a minute size in the sample W.

FIGS. 33, 34, and 35 show profiles of images formed on 10421, 10422, and 10423, respectively. 10421a to 10421c correspond to 1041a to 1041c, respectively, and similarly, 10422a to 10422c, and 10423a to 10423c are intensity profiles of images corresponding to 1041a to 1041c.

Since the intensity profiles shown in FIGS. 33 to 35 are formed by different lenses constituting the lens array 1028c, θ1(i) is different. Therefore, sin θ3(i), which is a value proportional to the magnification, changes. When the number of openings of the detection unit 102 increases, a change of θ1 becomes larger in the same lens, and accordingly a change in magnification increases. This is a problem in configuring the photoelectric conversion unit 103 to be described later. Therefore, in FIG. 9, the cylindrical lens array 1028 is constituted by 1028a to 1028c in a manner that the images of 1041a to 1041c have a same interval in 10421 to 10423.

1028a is configured with cylindrical lenses 1028a1 to 1028aN. Similarly, the lens array 1028b is configured with cylindrical lenses 1028b1 to 1028bN. When a focal distance of the cylindrical lenses of 1028a1 to 1028aN is fa(1) to fa(N), and a focal distance of the cylindrical lenses of 1028b1 to 1028bN is fb(1) to fb(N), the focal distances are set by the following conditions (Formula 2 to Formula 4).

[Math 2]

$$\forall i, fa(i)+fb(i)=C1 \quad \text{(Formula 2)}$$

[Math 3]

$$\forall i, fa(i)\sin θ3(i)/fb(i)=C2 \quad \text{(Formula 3)}$$

[Math 4]

$$\forall i, fb(i)<fa(i) \quad \text{(Formula 4)}$$

Here, C1 and C2 are constants and are design parameters. In Formula 3, all of the lenses constituting 1028a and 1028b are required to meet a condition of the Kepler type magnification adjustment. Formula 3 is a condition for correcting the magnification that changes depending on a direction of incidence on the pupil, and setting magnifications of the images to be formed to be the same. Formula 4 is a condition for preventing light beam from being larger than an aperture of a lens in 1028b, and preventing occurrence of a decrease in transmittance.

Figure 11A:
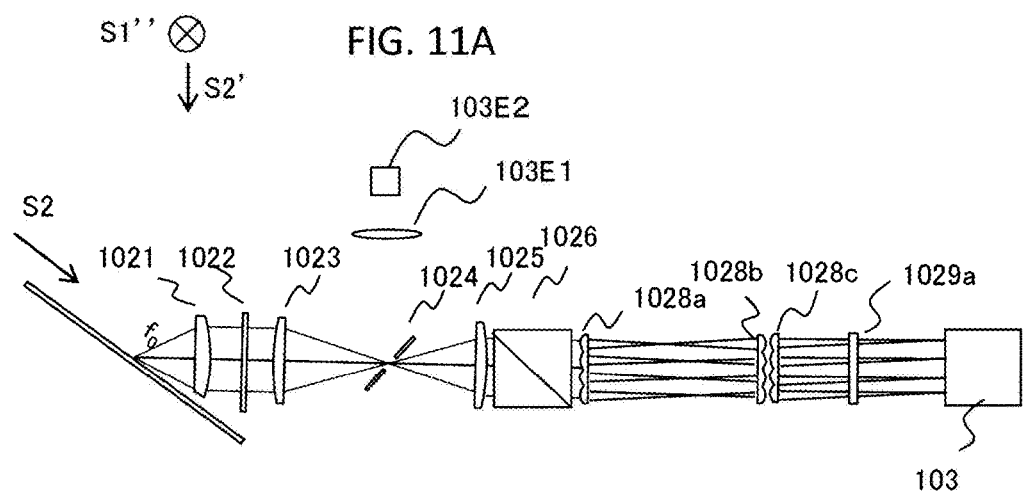
FIGS. 11A and 11B are diagrams showing the configuration of the detection unit.
Figure 11B:
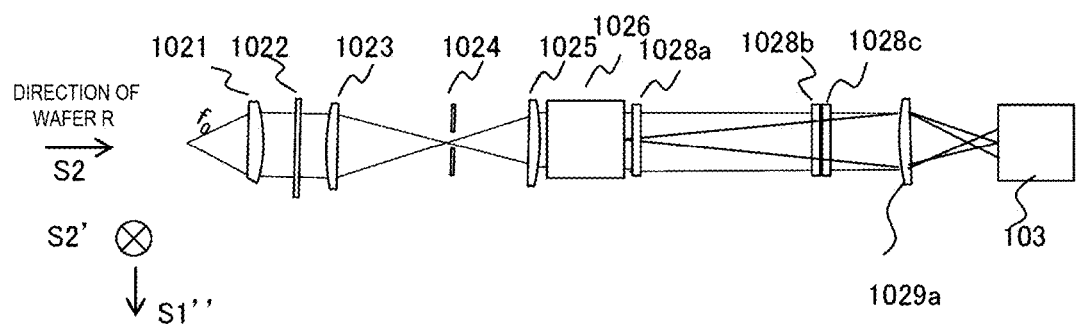
Figure 12A:
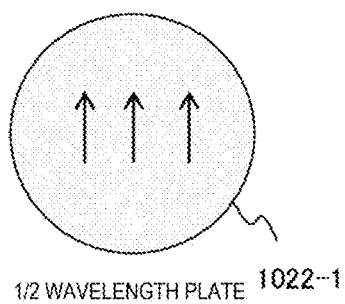
FIGS. 12A to 12C are diagrams showing a polarization control filter of the detection unit.
Figure 12B:
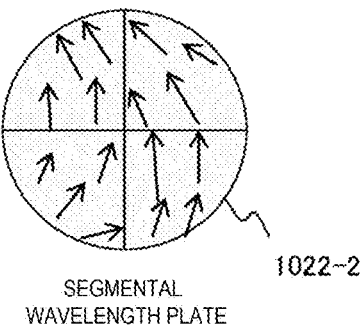
Figure 12C:
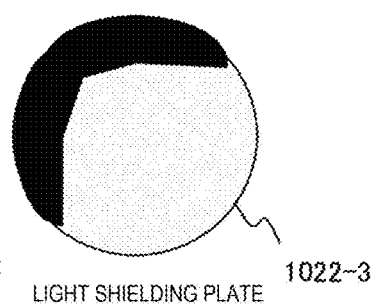

FIGS. 11A and 11B show the detection unit 102 from different viewpoints. FIGS. 12A to 12C show examples of the polarization control filter 1022.

1022-1 is a ½ wavelength plate (see FIG. 12A). Arrows indicate a direction of an advanced phase angle. Although 1022-2 is also a ½ wavelength plate, directions of the advanced phase angles in each area are set to be different (see FIG. 12B). Typically, the direction of the advanced phase angle is optimized such that the defect signal light amount regarding roughness scattered light from the sample surface is maximized at the photoelectric conversion unit 103 via the polarization beam splitter 1026. 1022-3 is a light shielding plate. The light shielding plate 1022-3 blocks light in an area where the roughness scattered light from the sample surface is dense (see FIG. 12C). The motors 1022-1 to 1022-3 are rotatable by a motor. The light shielding plate 1022-3 may be formed by a combination of rods, and each rod may be movable by a motor to change the light shielding area in accordance with a target sample.

FIG. 13 shows an illumination intensity profile of an irradiation on the sample surface by the defect inspection device. Here, a horizontal axis is the S2 direction.

A field of view is scanned in the spiral shape as shown in FIG. 3. A rotation angle of the sample W is θ1, coordinates change in the radial direction for each circle of a position of the field of view, and 9131 to 9133 are polar coordinate systems (r1, θ1), (r1+Δr, θ1), (r1−Δr, θ1). 9134 corresponds to the field of view determined by the opening 10241 (see FIG. 3). It is assumed that there is a huge defect at 9137. At the time, when the field of view is at the position of (r1, θ1) or (r1−Δr, θ1), the photoelectric conversion unit 103 cannot detect the defect since the reflected light from the defect 9137 does not pass through the opening 10241 (see FIG. 3).

As the field of view moves to a position corresponding to the profile of 9132, the defect of 9137 passes through the opening 10241. At the time, since 9137 is in the vicinity of the peak of the power density of the illumination, the photoelectric conversion unit 103 becomes saturated when 9137 is detected under the same condition as 9131. 9135 is reflected by the reflection portion 10242, converged by the light converging unit 103E1, and then detected by the photoelectric converting device 103E2.

The defect of 9137 is extracted and detected by comparison with a threshold value set in advance after the high pass filter in the signal processing unit 52 at a timing when the field of view is at (r1, θ1).

As shown in FIG. 13, a length from a center of the field of view of an area edge that can be detected at 103E2 under the condition in which the field of view is in (r1, θ1) is set as LE. The light amount D1 reflected from the defect is expressed by the following formula when an illumination peak intensity is P1, the detection efficiency of the reflected light of the photoelectric converting device 103E2 is DE1, and the length of an exp (−2) section from the peak intensity of the illumination is FVL.

[Math 5]

$$D1 = P1 \cdot DE1 \exp\left(-\frac{LE^2}{2(FVL/4)^2}\right) \quad \text{(Formula 5)}$$

On the other hand, when the field of view is at a position of (r1+Δr, θ1), the illumination peak intensity is P2, and the detection efficiency of the reflected light of the photoelectric conversion unit 103 is DE2. In the photoelectric conversion unit 103, a maximum detected light amount that can be detected without being affected by saturation is D_SAT.

In order to prevent the reflected light amount detected from the defect from being affected by saturation, the illumination light amount P2 is set such that an estimated value obtained by estimating the light amount of the defect represented by Formula 5 at the next round when the field of view is at (r1, θ1), that is, a position (r1+Δr, θ1) to which the field of view is moved, is not saturated.

When the illumination light amount is set to P2, the reflected light amount from the defect when the field of view is moved to (r1+Δr, θ1) is estimated as D2, which is controlled to meet the following Formula 6.

[Math 6]

$$D2 = P2 \cdot DE2 \exp\left(-\frac{(LE - \Delta r)^2}{2(FVL/4)^2}\right) = \frac{P2 \cdot DE2}{P1 \cdot DE1} D1 \exp\left(\frac{(2LE - \Delta r)\Delta r}{2(FVL/4)^2}\right) < D\_SAT \quad \text{(Formula 6)}$$

It can be seen that, although a detailed position of the defect in the range indicated by 9135 cannot be detected, the maximum amount of light is obtained in the next round when the defect is at a position away from the field of view by LE in the field of view (r1, θ1) since a maximum light amount obtained from the defect when the field of view is at (r1+Δr, θ1) is monotonically increased in relation to LE (Formula 6). If the defect is saturated, an accurate reflected light amount of the defect cannot be measured.

As shown in FIG. 13, since the position of the defect is calculated by detecting the defect a plurality of times while overlapping the fields of view and calculating an interpolation thereof, measurement accuracy of the position of the defect decreases when the defect is saturated. Therefore, DE2 and P2 when the field of view is at (r1+Δr, θ1) are calculated by 52 and transmitted to the control unit 53 so as to satisfy a condition in which the defect shown in Formula 6 is not saturated.

When the defect exists at 9138, the illumination intensity is very weak at the defect position and cannot be detected at the position where the field of view is (r1−Δr, θ1). Therefore, the defect is detected for the first time at the position where the field of view is (r1, θ1). At the time, the defect is detected not by the photoelectric converting device 103E2 but by the photoelectric conversion unit 103. Therefore, the output of the photoelectric conversion unit 103 is also transmitted to the signal processing unit 52, and the reflected light amount D2 from the defect in the next round, that is, at the position (r1+Δr, θ1), is estimated, and DE2 and P2 are determined.

In this way, the photoelectric converting device 103E2 outputs an electric signal corresponding to light reflected from the vicinity of the base of the Gaussian distribution of the illumination spot of the illumination unit 101 corresponding to a position excluding the vicinity of the position at which the illumination intensity of the illumination unit 101 is maximized. The signal processing unit 52 (reflected light amount estimation unit) estimates the reflected light amount at a specific timing from the sample W input by the photoelectric conversion unit 103 after the timing when the output of the photoelectric converting device 103E2 is acquired.

FIG. 15 shows an equivalent circuit of the photoelectric conversion unit 103 shown in FIG. 8.

103L1a denotes a pixel group of a pixel block 103L1 formed in 103L, which corresponds to W-a. 103L1b denotes a pixel group of the same pixel block, which corresponds to W-b. Each pixel group is constituted by an avalanche photodiode set to a plurality of Geiger modes, and a constant pulse current flows when a photon is incident on each of the avalanche photodiodes.

A reference numeral 103L2b denotes a pixel group of the pixel block 103L2 formed in the chip 103L, which corresponds to W-b. The pixel blocks 103L1 and 103L2 are the same pixel block group. 103R1a denotes a pixel group of the pixel block 103R1 formed in 103R, which corresponds to W-a. 103R1b denotes a pixel group of the same pixel block, which corresponds to W-b. 103R2b denotes a pixel group of the pixel block 103R2 formed in 103R, which corresponds to W-b. An output of 103L1a is electrically connected to an output of 103L2a. A sum of the currents flowing here is output from 500-a1. The output current is input to a current-voltage converting device 103A1 and converted into a voltage.

Similarly, the output currents of the pixel groups 103R1a to 103R2a corresponding to the W-a of the same pixel block group as 103R1 are electrically connected, and are output from 500-a3 and converted to voltage at 103A2. Similarly, the output currents of 103L1b to 103L2b and the output currents of 103R2b to 103R2b are also electrically connected, output from 500-b1 and 500-b3, and converted into voltages at 103B1 and 103 B2.

Although not shown, similarly, similar processing is performed on all output units illustrated in FIG. 8, that is, 500a-1 to 500h-1, 500-a2 to 500h-2, 500-a3 to 500h-3, and 500a-4 to 500h-4.

A voltage VR of the avalanche photodiode is supplied by a variable voltage source 1035 and a variable voltage source 1036. A power supply of the variable voltage source 1036 can be electrically disconnected from VR by a switching device 1037. The switching device 1037 is controlled by a control signal 1038 transmitted from the control unit 53.

Characteristics of the avalanche photodiode in Geiger mode are shown in FIG. 29.

FIG. 29 shows the multiplication rate and the detection efficiency when a reverse voltage of the avalanche photodiode is changed. 92901 represents the multiplication rate, and 92902 represents the detection efficiency. When a minute defect is detected, a high multiplication rate and high detection efficiency are required since the reflected light amount from the defect is low. Therefore, a voltage 92903 is used as the applied voltage.

On the other hand, for a huge defect, a reverse voltage of 92904 is used in order to prevent a saturation of the defect. A control of DE2 represented in Formula 6 is performed by the voltage applied to the avalanche photodiode. In order to prevent overlooking of the minute defect, it is necessary to shorten a time period of the voltage 92904. For this reason, a difference between the voltages of 92903 and 92904 matches the voltage of the variable voltage source 1036, and a time period for disconnecting the variable voltage source 1036 is set to several microseconds or less. Typically, a voltage of the variable voltage source 1036 is 5-10 V.

FIG. 16 shows a temporal change in the detected light amount when a defect is detected by the defect inspection device shown in FIG. 1. The sample W is moved in the direction S1 of FIG. 2. The horizontal axis represents the time period, and the vertical axis represents the output of the sensor. 9161 represents a reflected light intensity from a small defect, and 9262 represents a reflected light intensity from a large defect. When a sensor showing a general linear characteristic is used, 9162 cannot be detected since the reflected light intensity reaches the saturation output of the sensor, resulting in an output shown at 9163.

FIG. 17 is a characteristic graph showing correspondence between the number of input photons and the sensor output in the sensor of FIG. 8. Here, if the laser light source 2 is a pulsed laser and the interval between laser pulses is longer than a recovery time period of the sensor, the sensor output O (I, G) is represented by Formula 7.

[Math 7]

$$O(I, G) \propto \int_{x \in P(G)} N(G)\left(1 - \left(\frac{N(G)-1}{N(G)}\right)^{d(x) \cdot I \cdot PDE}\right) dx \quad \text{(Formula 7)}$$

Here, d(x) is the intensity distribution of the reflected light from the sample passing through a position x of the pupil of 1021, PDE is the detection efficiency of the sensor in FIG. 8, I is the number of input photons from the sample, and N is the number of avalanche photodiodes constituting the pixel block group G.

At the time, as indicated by 9171 in FIG. 17, the sensor output O (I, G) regarding the input of photons has an asymptotic characteristic as the number of input photons increases. Here, when a continuous oscillation laser is applied, the linearity of Formula 7 is improved. This means that when the current output of the range to saturation is measured, the current value corresponding to one photon becomes small, that is, the current amplification rate is substantially reduced.

As a result, if the saturation of the large defect is to be prevented, a strength of a defect signal regarding a circuit noise is relatively reduced, and the SNR is deteriorated. In the first embodiment, when a large number of photons are incident by applying the pulsed laser, the photons are made more likely to asymptotically approach.

FIG. 18 shows an output signal from a sensor that is detected when the defect shown in FIG. 16 is detected under the condition of FIG. 17. 9181 is a signal of the small defect, and 9182 is a signal of the large defect.

In 9182, when the number of input photons is large, a profile is obtained in which the intensity of a peak part of the Gaussian distribution that is a power density distribution of the illumination is reduced due to an asymptotic nature of a sensor output. On the other hand, the sensor output regarding the number of input photons is known as shown in Formula 7, and the number of photons can be estimated from the sensor output.

The correspondence is shown in 9191 of FIG. 19. By converting the reflected light amount signal from the defect obtained as 9182 into a conversion table corresponding to 9191 and performing processing, a dynamic range can be increased.

FIG. 20 shows an example of the processing. The photoelectric conversion unit 103 outputs 500-1 to 500-4 from different block groups. Voltage corresponding to the current output from 500a-1 to 500a-h shown in FIG. 8 is input from 500-1. Similarly, voltage corresponding to output currents of 103 is input from 500-2 to 500-4. Accordingly, the output of each block group is input independently.

5101-1 to 5101-4 are AD converting devices. An oscillation synchronization signal of the laser is input, sampling is performed in synchronization with the oscillation synchronization signal, and a signal is converted into a digital value. By synchronizing with laser oscillation, it is hard to be affected by noise such as a dark current, and the output is easy to approach asymptotically when detected light amount is large. 5102-1 to 5102-4 are linear restoration devices. The linear restoration is also performed in synchronization with the laser oscillation. Usually, in order to acquire data while moving the laser irradiation position at high speed, for example, when a low-frequency pass filter is inserted in a stage before the linear restoration, the signal output by the photoelectric conversion unit 103 is changed from an original waveform, and accurate restoration becomes impossible.

In particular, as shown in FIG. 3, when the rotation stage is set at a constant speed while the field of view is rotated in a spiral shape, the moving speed of the field of view changes on an inner peripheral side and an outer peripheral side. In the laser oscillation, linear restoration can be performed without being affected by the moving speed of the stage by synchronizing therewith since an emission time period is typically in an order of picoseconds.

5103-1 to 5103-4 are multipliers, and the outputs of 5102-1 to 5102-4 are respectively multiplied by a weight and added at 5104-1. 5105 is a normalization processing unit, which restores a change in the light amount due to the change in the multiplication rate and the detection efficiency by controlling the reverse voltage applied to the photoelectric conversion unit 103. When a relatively large defect is detected by the photoelectric converting device 103E2, it is assumed that the reverse voltage of the defect position in the next round is changed instantaneously from 92903 to 92904 (see FIG. 29).

As a result, if a product of the multiplication rate and the detection efficiency is m times, normalization is performed by multiplying data acquired under the condition by an inverse time of m in 5105. The illumination intensity in an area where a huge defect is found is suppressed. The intensity change of the illumination is normalized at 5105 in the same manner.

FIG. 21 is an embodiment different from the embodiment of FIG. 20. Voltage is amplified in an analog manner by 5103-5 to 5103-8, added by an analog adding device 5104-2, and then sampled in synchronism with a laser oscillation frequency in an AD converting device 5101-5 and converted into a digital value.

Although the output of 500-1 to 500-4 is first converted into a digital value by the AD converting device in the embodiment of FIG. 20, the method is susceptible to quantization noise and digital noise in the AD converting device, and the SN is likely to decrease when the detected light amount is weak. In the method of FIG. 21, robustness against noise can be improved. 5102-5 is a linear restoration device. In 5102-5, it is necessary to have a configuration different from that of 5102-1 to 5102-4 in order to restore the sum of outputs of the plurality of block groups.

FIG. 22 is a timing chart during the inspection of the defect inspection device of FIG. 1.

92201 represents a detection light amount of the photoelectric converting device 103E2, 92202 represents a detection light amount of the photoelectric conversion unit 103, 92203 represents a control signal value from the control unit 53, and 92204 represents an output of the laser light source 2. 92205 and 92206 are signals from the defect. For 92205, the control unit 53 outputs a signal for controlling the reverse voltage of the laser and the photoelectric conversion unit 103 as indicated by 92210 after a time period Δt when the sample W rotates for one circle because of a sufficient light amount. Accordingly, the output of the laser is prevented at 92212, and accordingly, the defect signal 92207 detected by the control unit 103 is not an excessive output.

Although not shown, the reverse voltage of the control unit 103 is also set low at a timing 92210.

For 92206, since the photoelectric conversion unit 103E does not detect a sufficient light amount corresponding to the defect at the position 9138 in FIG. 13, the reverse voltage of the laser illumination and the photoelectric conversion unit 103 is not controlled after Δt, and a relatively large light amount is detected at 92208. However, since the light amount increases in the next round, the reverse voltage of the laser output and the photoelectric conversion unit 103 is prevented as indicated by 92211 after Δt. The detected light amount 92209 is an appropriate light amount under the control of 92211.

FIG. 23 shows a mechanism for controlling the illumination intensity.

The polarization voltage control unit 13 receives a control signal from the control unit 53 from 1301, and applies a voltage at a GND electric potential or at an electric potential set by a high voltage source 1303 to the electro-optical element 8 by a switching device 1302. Although the laser light output from the laser light source 2 is given by P-polarized light as indicated by 8001, the polarization rotates in φ direction when a predetermined voltage is polarized to the electro-optical element 8. The polarization beam splitter 9 splits the P-polarized light and the S-polarized light, and branches only the S-polarized light into an optical path provided in the beam splitter 10. The light in the P polarization direction is guided to the polarization control unit 6 in a subsequent stage, and then illuminates the sample W.

11 is a diffuser, and absorbs unnecessary light. The light branched by the beam splitter 10 is detected by the photoelectric conversion unit 12. By monitoring the light amount, the light amount illuminated on the sample W can be obtained. The light detected by the photoelectric conversion unit 12 is guided to the signal processing units 51, 52, and is used for processing of the normalization processing unit of the signal 5105 in the signal processing unit 51. The signal processing unit 52 also uses normalization processing for calculating the light amount detected by the photoelectric converting device 103E.

The high voltage source 1303 can control the voltage with the control unit 53. In general, it is difficult to expect a high speed for the control of the voltage by the high voltage source 1303, and typically changes over a time period of about several tens of milliseconds, and the switching device 1302 switches the voltage in a time period of several microseconds. The light amount of the next round is calculated based on Formula 6 using the light amount of the defect detected by the photoelectric conversion unit 103E or the photoelectric conversion unit 103, and the voltage of the high voltage source 1303 is adjusted such that the light amount falls within a desired range.

FIG. 24 shows an intensity profile when the illumination intensity is changed.

92401 is a profile when all light is controlled to irradiate the sample W by the polarization beam splitter 9. The horizontal axis is the S2 direction. 92402 is a light amount profile of the next round. Imaging is detected by dividing the field of view into eight, and as a result of detecting a large defect in 92403 of the divided fields of view, the laser intensity of 92402 is inhibited.

92404 is a light intensity plotted in the S1 direction without inhibiting the laser intensity in the round of 92402. On the other hand, 92405 is a profile in which the laser intensity reaching the sample surface is inhibited by applying a predetermined voltage to 8 at the position where the defect is found by the laser intensity. 92406 is a profile obtained by performing the normalization processing by 5105. The noise increases as a result of increase in the gain of the section 92407. Therefore, the section in which the gain has been changed by the normalization processing is corrected so as not to detect the noise in a subsequent defect detection processing in consideration of the gain.

FIG. 25 shows a processing of a subsequent stage by the signal processing unit.

51060 is a band-pass filter which is a Gaussian smoothing filter equivalent to a beam profile of illumination. 51061 is a memory which is used for storing data for several rounds. Data obtained at the same position in different rounds is added to each other at 51062. 51063 is a low frequency filter which is used to perform smoothing in both directions of the S1 and S2. High frequency data is output at 5106-out by subtracting the smoothed data at 51064. The smoothed data is output at 5106-out.

FIG. 26 shows integration between different sensors.

The sensors 5106A-out to 5106N-out combine the output with different sensors respectively in the same manner as in FIG. 25. 51071A to 51071K are integrated processing units, and typically multiply the outputs of a plurality of sensors by individually determined gains, and then combine the integrated images obtained by adding the multiplied results. 51072A to 51072K are evaluation image generation units.

Typically, an image with a normalized signal strength is generated based on variations in each image. 51073 is a determination unit. 5107ATh to 5107NTh are determination thresholds. A defect is extracted based on a combination of the determination threshold and an evaluation image. The defect is generally manifested across a plurality of pixels. Therefore, coordinate accuracy is improved by obtaining a position of a center of gravity of the light intensity distribution in a unit of sub-pixel. The size of the defect is estimated based on the light amount.

A brightness when the standard particles of a plurality of sizes are detected in advance is measured, the brightness value of the defect with the brightness value of the detected defect are compared, and the size of the defect is estimated by interpolation from the brightness of the standard particles closest to the brightness of the defect to be obtained.

Figure 27A:
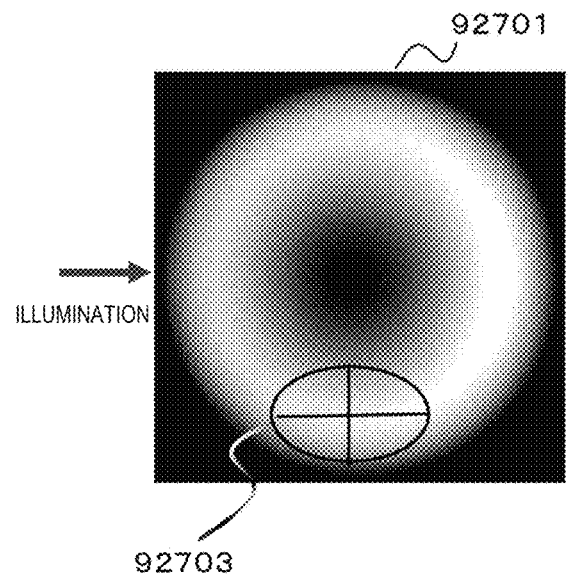
FIGS. 27A to 27C are diagrams showing a reflected light distribution and a linear restoration table.
Figure 27B:
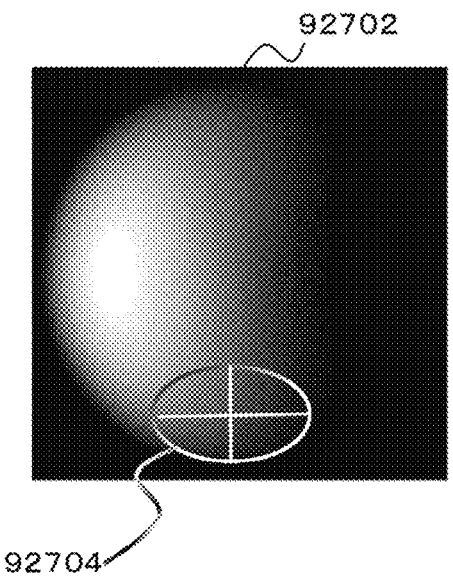
Figure 27C:
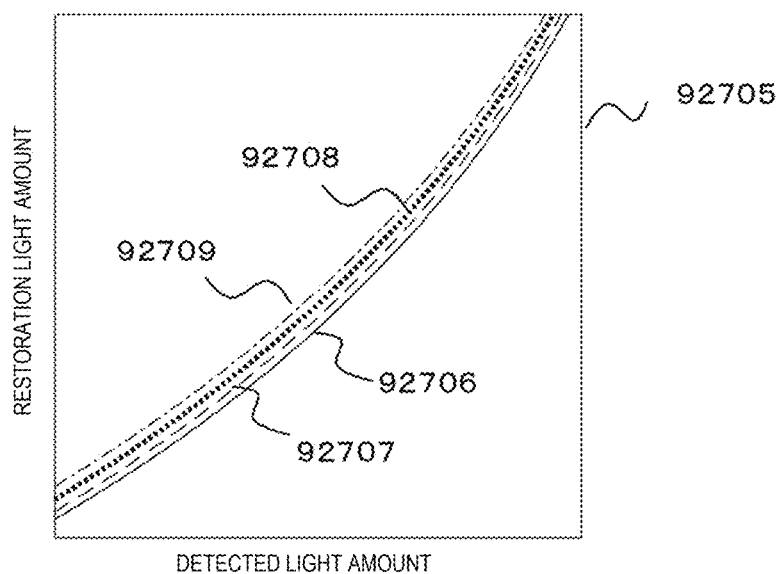

FIGS. 27A to 27C show a reflected light distribution 92701 (FIG. 27A) from a foreign object and reflected light distribution 92702 (FIG. 27B) from a roughness on the sample surface in polar coordinate systems. A center position is a zenith direction, and the laser is incident from a left side. 92703 and 92704 are detection areas of a specific sensor, and the sensor divides each area into four block groups.

The light amount detected by the sensor is a sum of an amount of reflected light from the foreign object and an amount of reflected light from the roughness. It can be seen that distributions of the reflected light of the foreign object and the roughness in each block group are different from the comparison of 92703 and 92704. In the device, since the illumination intensity can be changed by controlling the electro-optical element 8, the size of the foreign object is not necessarily the same even if the photoelectric conversion unit 103 obtains almost the same detected light amount.

When a large foreign object is irradiated with a laser having a weak intensity, the distribution is close to the reflected light distribution 92701, and when a small foreign object is irradiated with a laser having a strong intensity, the distribution is close to the reflected light distribution 92702. Therefore, although the light amount detected by each block group is uniform in the distribution of 92701, the light amount on an incident side of the illumination is strong in the distribution of 92702. As a result, the distribution of photons incident on the avalanche photodiode formed in the photoelectric conversion unit 103 changes, and an output light amount regarding the detected light amount changes. The problem corresponds to performing linear restoration corresponding to the irradiating laser intensity.

92705 (FIG. 27C) is a linear restoration correspondence graph, a horizontal axis represents a detected light amount, and a vertical axis represents a restoration light amount.

92706 to 92709 are graphs corresponding to different laser irradiation intensities. In particular, in the configuration shown in FIG. 21, since the linear restoration is performed in 5102-5 after the sum of the outputs of the block groups is calculated, a corresponding table for linear restoration is specified by inputting the illumination intensity data in 5102-5 to perform the restoration since a change in the characteristic of the sensor output due to the laser intensity is increased. The correspondence relationship 92705 is obtained by a real device.

FIG. 28 is a GUI of the display unit 54.

5401 is a detector for measuring and gains given to the outputs of the block groups. The laser intensity changes when the rotation angle of the attenuator 3 is changed. The standard particles are measured with different laser intensities, and the illumination intensity and the detected light amount are plotted in 5402. Gain1 to GainE that can be input in 5401 are gains for the output of the block group. The input and output characteristics of the block group regarding the standard particle are measured by setting only a gain of a specific block group and setting the other gain to 0. The above is performed on all block groups and all sensors, and the correspondence relationship 9191 is obtained.

5403 is a distribution of the reflected light from the roughness on the sample. The measurement is performed by using a target inspection sample with a laser intensity for inspecting the sample. 5404 and 5405 are light amounts detected by block groups formed in different sensors. In this embodiment, the number of block groups is 6. The reflected light from the roughness of each block group is obtained by setting the gain for the output of the block. Although not shown, when the field of view is divided, each divided field of view (for example, W-a to W-d in FIGS. 7A and 7B) is measured for each data. The obtained reflected light from the roughness is regarded as an offset in defect detection of each block group.

Figure 36A:
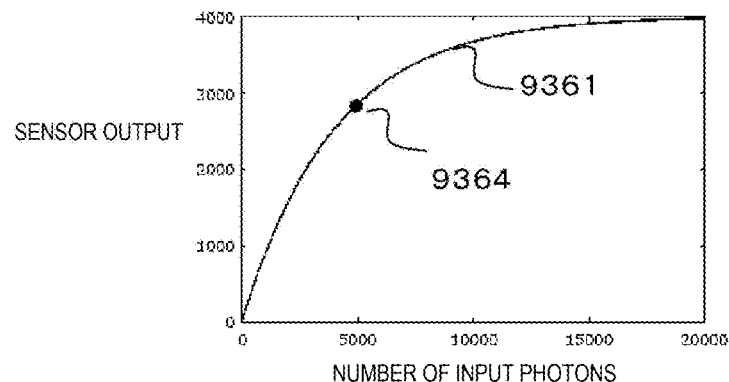
FIGS. 36A to 36C are diagrams illustrating a sensor output change depending on reflected light from the sample surface.
Figure 36B:
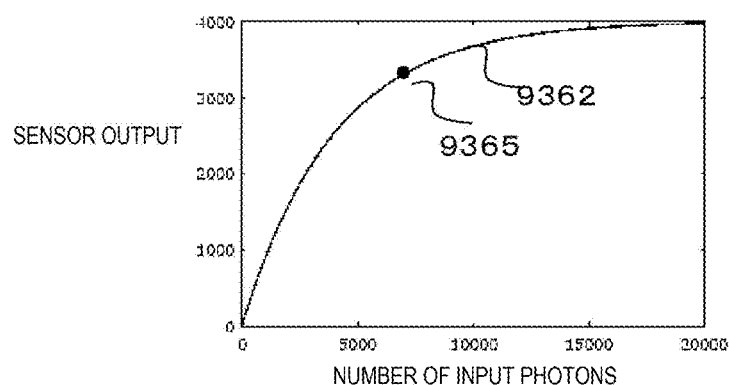
Figure 36C:
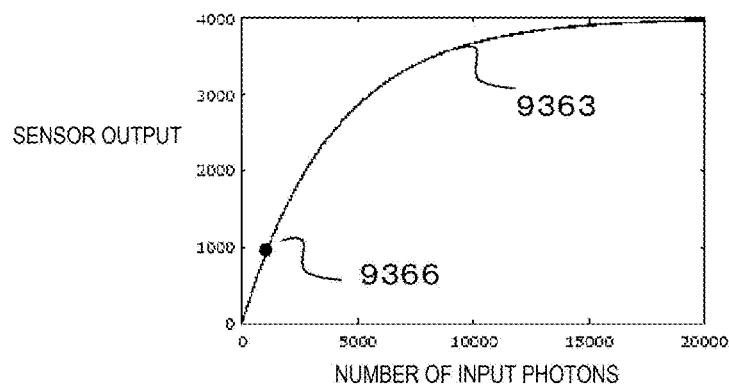

The above is shown in FIGS. 36A to 36C. 9361 to 9363 are output characteristics regarding incident light of each block group, and are calculated by measurement indicated by 5402, respectively. 9364 to 9366 are reflected light from the roughness on the sample surface, and calculated by measurement of 5403. The calculated results are multiplied by the gain of 5103-5 to 5103-8 from the sensor, and then added at 5104-2. Therefore, after an operation point is combined with the reflected light from the roughness on the sample surface, the respective input and output characteristics are multiplied by the gain, the results are added, and the linear restoration table is calculated based on the added result.

Second Embodiment

Although an imaging optical system is used as the detection unit 102 in the first embodiment, the detection unit 102 is a converging optical system in the second embodiment.

FIG. 30 shows a configuration of the detection unit 102. 1021 to 1026 have the same configurations as in FIGS. 11A and 11B. 1028a to 1028c for forming the image of the illumination in the S2 direction are unnecessary. After polarized light is branched at 1026, 1029b forms an image of a pupil plane of 1021 at 103b, and 1029c forms an image of the pupil plane 1021 at 103c. In the configuration of FIGS. 11A and 11B, a defect that emits a defect reflected light having a polarization characteristic different from a normal state can be detected by detecting the shielded light of the polarization component.

The configurations of 103b and 103c are shown in FIG. 31.

Since imaging of the sample surface is not detected, four groups of 1031L2, 1032L2, 1031-R2, and 1032-R2 are formed, and the avalanche photodiodes in Geiger mode formed in each group are current-connected. The detected current is output from 500a0 to 500d0. The configuration of the avalanche photodiode is the same as that of FIG. 15 except that all photodiodes in the block group are current-connected. That is, the voltage of the reverse voltage controlling an operation of Geiger mode may change instantaneously and typically in an order of microseconds.

Unlike the configuration in FIGS. 11A and 11B, an accuracy of interpolation calculation is important in the calculation of the position of the detected defect since the imaging is not detected. A position of the defect in the S2 direction is obtained by the following Formula 8 since a distribution of the illumination in the S2 direction is a Gaussian distribution.

[Math 8]

$$r = \frac{(lw/4)^2}{\Delta R}\left(\log\left(\frac{LUT(d(t_1), I(t_1)) - LUT(\text{Haze}(t_1))}{\text{gain}(t_1)}\right) - \log\left(\frac{LUT(d(t_{-1}), I(t_{-1})) - LUT(\text{Haze}(t_{-1}))}{\text{gain}(t_{-1})}\right)\right) \quad \text{(Formula 8)}$$

Here, 1 w is an illumination width in the S2 direction of the range having an intensity of exp (−2) of the peak of the Gaussian distribution of the illumination, ΔR is a movement pitch in the S2 direction of the movement each round, $t_1$ and $t_{-1}$ are the timings of the two times when the maximum defect reflected light intensity is detected in the vicinity of the detected defect, and d ($t_1$) and d ($t_{-1}$) are the light amount detected in the time period. LUT is a linear restoration table, gain is a change rate of the detected light amount by controlling the illumination intensity or the reverse voltage. For example, gain is 1/40 when the illumination light amount is 1/10 and the amplification rate of the sensor is 1/4.

Haze is the reflected light amount from the sample surface, and I is the illumination intensity. A position r of the defect in the S2 direction is calculated by normalizing the non-linearity of the sensor that affects the two detected light amounts used for interpolation, the illumination intensity, and the change in the gain of the sensor. The brightness of the defect is obtained by the following Formula 9 using the nature of the Gaussian distribution.

[Math 9]

$$f(\text{size}) = \left(\frac{LUT(d(t_i), I(t_i)) - LUT(\text{Haze}(t_i), I(t_i))}{\text{gain}(t_i)} - \right)\left(\exp\left(-\frac{(x-\Delta R)^2}{2(l/4)^2}\right)\right)^{-1} \quad \text{(Formula 9)}$$

The defect size is estimated in response to the brightness of the standard particle whose size is known since the size of the defect correlates with the brightness of the defect.

Third Embodiment

FIG. 14 shows an embodiment in which illumination intensity control by the electro-optical element 8 is different.

The electro-optical element transmits a laser with a desired intensity to the sample by changing a polarization angle. However, it is difficult to set the light amount to several percent or less since the electro-optical element cannot be completely linearly polarized. On the other hand, since the light emitted from the defect is proportional to sixth power of the size of the defect due to Rayleigh scattering, the light amount become about sixth power of 10 times when the size becomes 10 times. Therefore, it is desirable to further inhibit the laser intensity in order to measure the light amount in relation to a huge defect accurately.

Therefore, in the embodiment according to FIG. 14, the electro-optical element and the polarization beam splitter are directly structured in two stages. 8-1 and 8-2 are electro-optical elements, 9-1 and 9-2 are polarization beam splitters, 13-1 and 13-2 are polarization voltage control units, and 11-1 and 11-2 are beam diffusers. According to the configuration, the laser light amount on the sample surface can be stabilized to $1/1000$ or less, and the reflected light intensity can be kept within a measurement range even for a huge defect.

REFERENCE SIGN LIST 2 light source
3 attenuator
4 emission light adjustment unit
5 beam expander
6 polarization control unit
7 illumination intensity distribution control unit
8 electro-optical element
9 polarization beam splitter
10 beam splitter
11 beam diffuser
12 photoelectric converting device
13 polarization voltage control unit
51 signal processing unit
52 signal processing unit
53 control unit
54 display unit
55 input unit
101 illumination unit
102 detection unit
103 photoelectric conversion unit
103E photoelectric conversion unit
104 stage unit
105 signal processing unit
1021 objective lens
1022 polarization control filter
1023 polarization control filter
1024 aperture
1025 converging lens
1026 polarization beam splitter
1027 diffuser
1028 lens array
1029 lens array

The invention claimed is:
1. A defect inspection device comprising:
a pulse oscillation light source;
an illumination unit that guides light output from the light source to a sample;
a scanning unit that controls a position at which the sample is scanned by the illumination unit;
a light converging unit that converges light reflected from the sample;
a first photoelectric conversion unit that outputs an electric signal corresponding to the light converged by the light converging unit;
an Analog-to-Digital (AD) conversion unit that converts the electric signal output from the first photoelectric conversion unit into a digital signal in synchronization with a pulse oscillation of the light source;
a linear restoration unit that processes a digital signal converted by the AD conversion unit in synchronization with a pulse oscillation output by the AD conversion unit and corrects nonlinearity of the first photoelectric conversion unit;
a defect detection unit that detects a defect of the sample based on an output of the linear restoration unit;
a processing unit that obtains and outputs a position and a size of the defect detected by the defect detection unit;
a second photoelectric conversion unit that outputs an electric signal corresponding to light reflected from a predetermined position of the illumination unit; and
a reflected light amount estimation unit that estimates a reflected light amount at a specific timing from the sample input by the first photoelectric conversion unit after a timing when an output of the second photoelectric conversion unit is acquired, wherein
the light converging unit includes an aperture which is provided with an opening portion arranged in a central portion and a reflection portion arranged at an end portion, and
light passing through the opening portion is detected by the first photoelectric conversion unit, and light reflected by the reflection portion is detected by the second photoelectric conversion unit.

2. The defect inspection device according to claim 1, wherein
the first photoelectric conversion unit includes a plurality of photoelectric conversion elements operating in a Geiger mode.

3. The defect inspection device according to claim 1, wherein
the second photoelectric conversion unit outputs an electric signal corresponding to the light reflected from the vicinity of the base of a Gaussian distribution of the illumination spot of the illumination unit.

4. The defect inspection device according to claim 1, further comprising:
a dividing unit that divides the light converged by the light converging unit into the first photoelectric conversion unit and the second photoelectric conversion unit and outputs the divided light.

5. The defect inspection device according to claim 1, wherein
the illumination unit includes a polarization control unit that controls a polarization direction of the light output from the light source; and
a light amount control unit that guides the light in a specific polarization direction to the sample within a polarization direction controlled by the polarization control unit, wherein
the polarization control unit and the light amount control unit reduce a light amount of the light guided to the sample by changing a polarization direction of the light at a timing when the reflected light amount estimation unit estimates that a reflected light amount equal to or more than a measurement range of the first photoelectric conversion unit is detected.

6. The defect inspection device according to claim 5, wherein
the light amount control unit is configured by a combination of at least one serially connected electro-optical element and a polarization beam splitter.

7. The defect inspection device according to claim 1, wherein
the first photoelectric conversion unit includes
a plurality of avalanche photodiodes operating in a Geiger mode; and
an amplification rate switching unit configured to switch an amplification rate of the electric signal in a time period of equal to or less than 1 millisecond, wherein
the amplification rate switching unit decreases the amplification rate at a timing when the reflected light amount estimation unit estimates that a reflected light amount equal to or more than the measurement range of the first photoelectric conversion unit is detected by controlling a reverse voltage of the avalanche photodiodes.

8. The defect inspection device according to claim 2, wherein
the photoelectric conversion element of the first photoelectric conversion unit is electrically connected to each predetermined area and outputs the electric signal by separating the ones which are electrically connected to each other, and
the area corresponds to a position of the sample.

9. The defect inspection device according to claim 2, wherein
the photoelectric conversion element of the first photoelectric conversion unit is electrically connected to each predetermined area and outputs the electric signal by separating the ones which are electrically connected to each other, and
the area corresponds to a position of the pupil plane of the light converging unit.

10. The defect inspection device according to claim 2, wherein
the photoelectric conversion element of the first photoelectric conversion unit is electrically connected to each predetermined area and outputs the electric signal by separating the ones which are electrically connected to each other, and
the area corresponds to a position where the sample surface and the pupil plane of the light converging unit are combined.

* * * * *